United States Patent
Sekiwa et al.

(10) Patent No.: US 7,708,831 B2
(45) Date of Patent: May 4, 2010

(54) PROCESS FOR PRODUCING ZNO SINGLE CRYSTAL ACCORDING TO METHOD OF LIQUID PHASE GROWTH

(75) Inventors: Hideyuki Sekiwa, Tokyo (JP); Jun Kobayashi, Tokyo (JP); Miyuki Miyamoto, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 12/224,500

(22) PCT Filed: Feb. 28, 2007

(86) PCT No.: PCT/JP2007/054380

§ 371 (c)(1),
(2), (4) Date: Aug. 28, 2008

(87) PCT Pub. No.: WO2007/100146

PCT Pub. Date: Sep. 7, 2007

(65) Prior Publication Data
US 2009/0044745 A1 Feb. 19, 2009

(30) Foreign Application Priority Data
Mar. 1, 2006 (JP) .............................. 2006-055590

(51) Int. Cl.
C30B 19/00 (2006.01)
C30B 28/10 (2006.01)
C30B 11/00 (2006.01)

(52) U.S. Cl. .............................. 117/54; 117/17; 117/20; 117/40; 117/80

(58) Field of Classification Search ....................... 117/2, 117/3, 34, 17–20, 35–44, 54, 64–67, 80; 252/373
See application file for complete search history.

(56) References Cited

U.S. PATENT DOCUMENTS

| | | | | |
|---|---|---|---|---|
| 3,370,963 A | * | 2/1968 | Bonner et al. | ................. 117/80 |
| 3,751,309 A | * | 8/1973 | Derick et al. | ................. 117/17 |
| 5,162,299 A | * | 11/1992 | Pastor et al. | ................ 505/481 |
| 5,603,762 A | * | 2/1997 | Kokune et al. | ................ 117/60 |
| 6,039,802 A | * | 3/2000 | Sekijima et al. | ............... 117/49 |

(Continued)

FOREIGN PATENT DOCUMENTS

JP 04-367588 A 12/1992

(Continued)

OTHER PUBLICATIONS

Fischer et al., "On the Preparation of ZnO Single Crystals," Crystal Research and Technology, 1981, 16(6):689-694.

(Continued)

Primary Examiner—Robert M Kunemund
Assistant Examiner—G. Nagesh Rao
(74) Attorney, Agent, or Firm—Foley & Lardner LLP

(57) ABSTRACT

A method for producing a ZnO single crystal by a liquid phase growth technique, comprising the steps of: mixing and melting ZnO as a solute and $PbF_2$ and PbO as solvents; and putting a seed crystal or substrate into direct contact with the obtained melted solution, thereby growing a ZnO single crystal on the seed crystal or substrate.

19 Claims, 9 Drawing Sheets

U.S. PATENT DOCUMENTS

| | | | |
|---|---|---|---|
| 6,943,366 B2* | 9/2005 | Hori et al. | 257/13 |
| 7,172,956 B2* | 2/2007 | Hori et al. | 438/602 |
| 2002/0185055 A1 | 12/2002 | Oka | |
| 2004/0188691 A1* | 9/2004 | Hori et al. | 257/79 |
| 2005/0170539 A1* | 8/2005 | Hori et al. | 438/22 |
| 2007/0113952 A1* | 5/2007 | Nair et al. | 156/89.17 |
| 2009/0044745 A1* | 2/2009 | Sekiwa et al. | 117/36 |
| 2009/0092536 A1* | 4/2009 | Kawabata et al. | 423/409 |
| 2009/0101199 A1* | 4/2009 | Carroll et al. | 136/252 |
| 2009/0101210 A1* | 4/2009 | Carroll et al. | 136/261 |
| 2009/0101872 A1* | 4/2009 | Young et al. | 252/514 |
| 2009/0104456 A1* | 4/2009 | Carroll et al. | 428/434 |
| 2009/0104457 A1* | 4/2009 | Carroll et al. | 428/434 |
| 2009/0104461 A1* | 4/2009 | Young et al. | 428/447 |
| 2009/0107544 A1* | 4/2009 | Carroll et al. | 136/252 |

FOREIGN PATENT DOCUMENTS

| | | |
|---|---|---|
| JP | 2000-016900 A | 1/2000 |
| JP | 2002-193698 A | 7/2002 |
| JP | 2003-002790 A | 1/2003 |

OTHER PUBLICATIONS

Oka et al,. "Crystal growth of ZnO," Journal of Crystal Growth, Apr. 2002, 237-239:509-813.

Reynolds et al., "High-quality, melt-growth ZnO single crystals," J. Appl. Phys., May 1, 2004, 95(9):4802-4805.

* cited by examiner

Vaporizing amount when the PbF$_2$+PbO mixture is heat-treated at the melting point+200°C (wt%)

X-ray rocking curve of the ZnO film obtained in Example 2

X-ray rocking curve of the ZnO film obtained in Example 3

PROCESS FOR PRODUCING ZNO SINGLE CRYSTAL ACCORDING TO METHOD OF LIQUID PHASE GROWTH

CROSS-REFERENCE TO RELATED APPLICATIONS

This application is a National Stage application of PCT/JP2007/054380, filed Feb. 28, 2007, which claims priority from Japanese patent application JP 2006-055590, filed Mar. 1, 2006.

TECHNICAL FIELD

The present invention relates to a method for producing a ZnO single crystal thin film or a ZnO bulk single crystal by a liquid phase epitaxial growth technique (LPE technique), a flux technique, a top seeded solution growth technique (TSSG technique) or a solution growth technique.

BACKGROUND ART

ZnO, which has been used for varistors, gas sensors, sun block materials and the like, has recently been a target of attention as being applied to light emitting elements, piezoelectric elements, transparent electrodes and the like owing to optical characteristics and piezoelectric characteristics thereof. Especially, research and development activities are now eagerly conducted to apply ZnO for semiconductors used for light emitting elements which emit light of a short wavelength in the blue to ultraviolet range and applications thereof since ZnO has a direct bandgap of 3.3 to 3.4 eV like GaN. In order to apply ZnO for these uses and develop such uses, it is important to establish a method for producing high quality ZnO.

Conventional methods for growing ZnO, especially a ZnO single crystal, are roughly classified into gas phase growth techniques and liquid phase growth techniques. As the gas phase growth techniques, chemical vapor transport (see Japanese Patent Application Laid-Open No. 2004-131301), molecular beam epitaxy, metal organic chemical vapor deposition (see Japanese Patent Application Laid-Open No. 2004-84001), sublimation (see Japanese Patent Application Laid-Open No. 5-70286) and the like are used. These techniques cause many dislocations, defects and the like, and the quality of the resultant crystals is insufficient.

A method of producing a single crystal thin film of an oxide or a fluoride on a substrate by a gas phase growth technique is disclosed (see Japanese Patent Application Laid-Open No. 4-367588). This publication discloses "a method for epitaxially growing a single crystal of any compound of an oxide or a fluoride on a crystalline substrate, characterized by keeping a solution, obtained by dissolving the compound in a melt of a melting agent, in a crucible under an atmospheric pressure, keeping it at a temperature at which the solution is vaporized but the components of the solvent are not vaporized, solidifying a vapor of the compound vaporized from the solution on a surface of the crystalline substrate held on the solution and kept at a temperature lower than that of the solution, thereby forming a single crystal of the compound; and a method for epitaxially growing zinc oxide characterized in that the melting agent contains one or at least two of lead monoxide, lead fluoride, boron oxide and vanadium oxide as a main substance".

In the section of the examples, an example in which zinc oxide is used as a crystalline component, boron oxide and lead monoxide are used as melting agents, and only zinc oxide is vaporized steadily to epitaxially grow zinc oxide on a sapphire substrate. However, this method uses a gas phase growth technique and so involves a problem that the quality of the crystal is low.

A liquid phase growth technique, by which crystal growth proceeds with thermal equilibrium on principle, has an advantage of being capable of producing high quality crystals more easily than a gas phase growth technique. However, ZnO has a melting point as high as about 1975° C. and easily vaporizes and so it is difficult to grow ZnO by the Czochralski technique, which is used with silicon single crystal or the like. Therefore, a slow cooling technique, a hydrothermal technique, a flux technique, a floating zone technique, a TSSG technique, a solution growth technique and the like are used, by which a target subject is dissolved in an appropriate solvent and the temperature of the obtained mixture solution is decreased to realize a supersaturation state, thereby growing the target substance from the melted solution.

For growing a ZnO single crystal by a solution growth technique, a solvent capable of dissolving ZnO is needed. Substances used as the solvent are $PbF_2$, PbO, high temperature-high pressure water, $V_2O_5$, $B_2O_3$, $MoO_3$ and the like. Hereinafter, the problems of these solvents will be described.

A method of growing a ZnO single crystal by a slow cooling technique with $PbF_2$ as the solvent is disclosed (see J. W. Nielson and E. F. Dearborn, J. Phys. Chem. 64, (1960) 1762). FIG. 1 shows a $PbF_2$—ZnO phase diagram included in this document. $PbF_2$ and ZnO form an eutectic system. The composition of the eutectic contains ZnO at 8.8%, and the temperature thereof at this point is about 730° C. At or in the vicinity of a ZnO concentration of 8.8 mol %, PbO is also deposited. Therefore, the ZnO concentration needs to be at least about 10 mol %. In order to dissolve 10 mol % or more of ZnO, the temperature needs to be 770° C. or higher. A general practice to establish a stable and well-reproduceable method for growing a single crystal is to keep the solution at a temperature higher by 100 to 200° C. than the melting point thereof such that the solvent and the solute are uniformly mixed together. When the $PbF_2$ as the solvent is kept at about 870 to 970° C., $PbF_2$ is partially vaporized and so the composition with ZnO is varied. For this reason, it is difficult to stably grow a ZnO single crystal. In addition, since the vaporized $PbF_2$ reacts with materials of the members of the furnace, the number of times that the members is usable is reduced and also hazardous Pb compounds volatize. This, for example, requires the growth furnace to have a sealable structure, which increases the production cost.

PbO as the solvent has a disadvantage of having a high vapor pressure like $PbF_2$. FIG. 2 shows a PbO—ZnO phase diagram (see M. P. Bauleke, K. O. McDowell, J. Am. Ceram. Soc. 46[5] 243 (1963)). In order to dissolve about 12 mol % or more of ZnO, which is the only substance deposited, the temperature needs to be 861° C. or higher. In order to establish a stable and well-reproduceable method for growing a single crystal, the solution needs to be kept at about 960° C. to 1060° C. such that the solvent and the solute are uniformly mixed together. When the PbO as the solvent is kept at about 960 to 1060° C., PbO is partially vaporized and so the composition with ZnO is varied. For this reason, it is difficult to stably grow a ZnO single crystal. In addition, since the vaporized PbO reacts with materials of the members of the furnace, the number of times that the members is usable is reduced and also hazardous Pb compounds volatize. This, for example, requires the growth furnace to have a sealable structure, which increases the production cost.

With a hydrothermal technique using high temperature-high pressure water as the solvent, a relatively high quality ZnO single crystal is obtained. However, this technique requires about 2 weeks to obtain a crystal of about 10 mm cube and so has a problem of a slow growth rate (Sekiguchi, Miyashita, et al., Journal of the Crystallographic Society of Japan, 26(4) (1999) 39). A method of growing a ZnO single crystal by a solution growth technique or a traveling solvent zone melting technique using $V_2O_5$ and/or $B_2O_3$, $MoO_3$ as the solvent is disclosed (see Japanese Laid-Open Patent Publications Nos. 2002-193698 and 2003-2790, K. Oka and H. Shibata, J. Cryst. Growth 237-239 (2002) 509). Such a method can grow a ZnO single crystal on a seed crystal or substrate, but the resultant crystal is colored and is not considered to have a high level of crystallinity.

As described above, it is difficult to grow a ZnO single crystal stably and at low cost using $PbF_2$ or PbO as the solvent because the vapor pressure is too high. A hydrothermal technique using high temperature-high pressure water requires a period as long as 2 weeks to obtain a crystal of about 10 mm cube. A solution growth technique or a traveling solvent zone melting technique using $V_2O_5$ and/or $B_2O_3$, $MoO_3$ as the solvent has a problem that the quality of the crystal is low.

Use of $PbF_2$ as the solvent has a problem that the grown ZnO single crystal is contaminated with many fluorine (F) atoms mixed therein. Especially, the electric properties of semiconductor crystals are sensitive to the structure thereof, and impurity is one type of disturbance to the structure. A semiconductor is useful because the electric properties significantly vary in accordance with the type and concentration of the impurity added, and therefore it is very important to control the impurity. ZnO can be provided with n-type conductivity by substituting the O atom with a group VII atom such as fluorine or the like or by substituting the Zn atom with a group III atom such as boron, aluminum, gallium, indium or the like. ZnO can be provided with p-type conductivity by substituting the O atom with a group V atom such as nitrogen or the like or by substituting the Zn atom with a group I atom such as lithium or the like. However, the above-described method causes the grown single crystal to be contaminated with many fluorine atoms, which provide ZnO with n-type conductivity but are difficult to be controlled or inhibit ZnO from being provided with p-type conductivity.

There is another problem that the ZnO thin film is contaminated with many Al impurities from the materials of the members of the production furnace. When a conventional production furnace is used, the grown single crystal is contaminated with many Al impurities, which provide ZnO with n-type conductivity but are difficult to be controlled or inhibit ZnO from being provided with p-type conductivity.

DISCLOSURE OF THE INVENTION

The present invention has an object of providing a method for producing a high quality ZnO single crystal with very few dislocations and defects and very little coloring or the like by a liquid phase growth technique.

Another object of the present invention is to provide a method for producing a high quality ZnO single crystal less contaminated with fluorine impurities by a liquid phase growth technique.

Still another object of the present invention is to provide a method for producing a high quality ZnO single crystal with very little contamination by Al impurities by a liquid phase growth technique.

A first embodiment of the present invention is directed to a method for producing a ZnO single crystal by a liquid phase growth technique, wherein ZnO, and $PbF_2$ and PbO as solvents, are mixed and melted, then a seed crystal or substrate is put into direct contact with the obtained melted solution, and the temperature is lowered, thereby growing ZnO, deposited into the melted solution as a result of supersaturation, on the seed crystal or substrate.

According to this embodiment, the vaporization of the solvents is suppressed. Therefore, the variance in the composition is small, and so the crystal can be grown stably. In addition, the wearing of the members of the furnace can be suppressed and so the growth furnace does not need to be of a sealable type. Therefore, the ZnO single crystal can be produced at low cost. Since the solution growth technique is used as the crystal growth technique, a high quality ZnO single crystal with very few dislocations and defects can be produced. The ZnO single crystal obtained by this embodiment is colorless and transparent and has a high level of crystallinity, and therefore is usable for electronic materials and devices using ZnO, which are expected to be developed in the future.

A second embodiment of the present invention is directed to a method for producing a ZnO single crystal by a liquid phase growth technique, wherein ZnO, and PbO and $Bi_2O_3$ as solvents, are mixed and melted, then a seed crystal or substrate is put into direct contact with the obtained melted solution, and the temperature is lowered, thereby growing ZnO, deposited into the melted solution as a result of supersaturation, on the seed crystal or substrate.

According to this embodiment, the solution growth technique is used as the crystal growth technique, and PbO and $Bi_2O_3$, which are melting agents formed of elements having large ion diameters and thus are unlikely to be incorporated into the ZnO crystal, are used. Thus, a high quality ZnO single crystal with very little contamination by impurities can be produced. Especially, a high quality ZnO single crystal with less contamination by fluorine impurities can be produced. The ZnO single crystal obtained by this embodiment is colorless and transparent and has a high level of crystallinity, and therefore is usable for electronic materials and devices using ZnO, which are expected to be developed in the future.

A third embodiment of the present invention is directed to a method for producing a ZnO single crystal by a liquid phase growth technique by which ZnO as a solute is melted in a solvent, then a seed crystal or substrate is put into direct contact with the obtained melted solution, and the temperature is lowered, thereby growing ZnO, deposited into the melted solution as a result of supersaturation, on the seed crystal or substrate, wherein the ZnO single crystal is grown using a growth furnace formed of a non-Al-based material.

According to this embodiment, the solution growth technique is used as the crystal growth technique. Therefore, a high quality ZnO single crystal with very few dislocations and defects and very little coloring can be produced. In addition, the concentration of Al, which acts as impurities which provide ZnO with n-type conductivity but are difficult to be controlled or inhibit ZnO from being provided with p-type conductivity can be reduced.

In this specification, the term "solute" refers to a substance which is dissolved in a solvent for forming a solution, and the term "solvent" refers to a substance acting as a medium for the substance to be dissolved for forming the solution.

BEST MODE FOR CARRYING OUT THE INVENTION

Hereinafter, the principle of a first embodiment of the present invention will be described.

Figure 3:
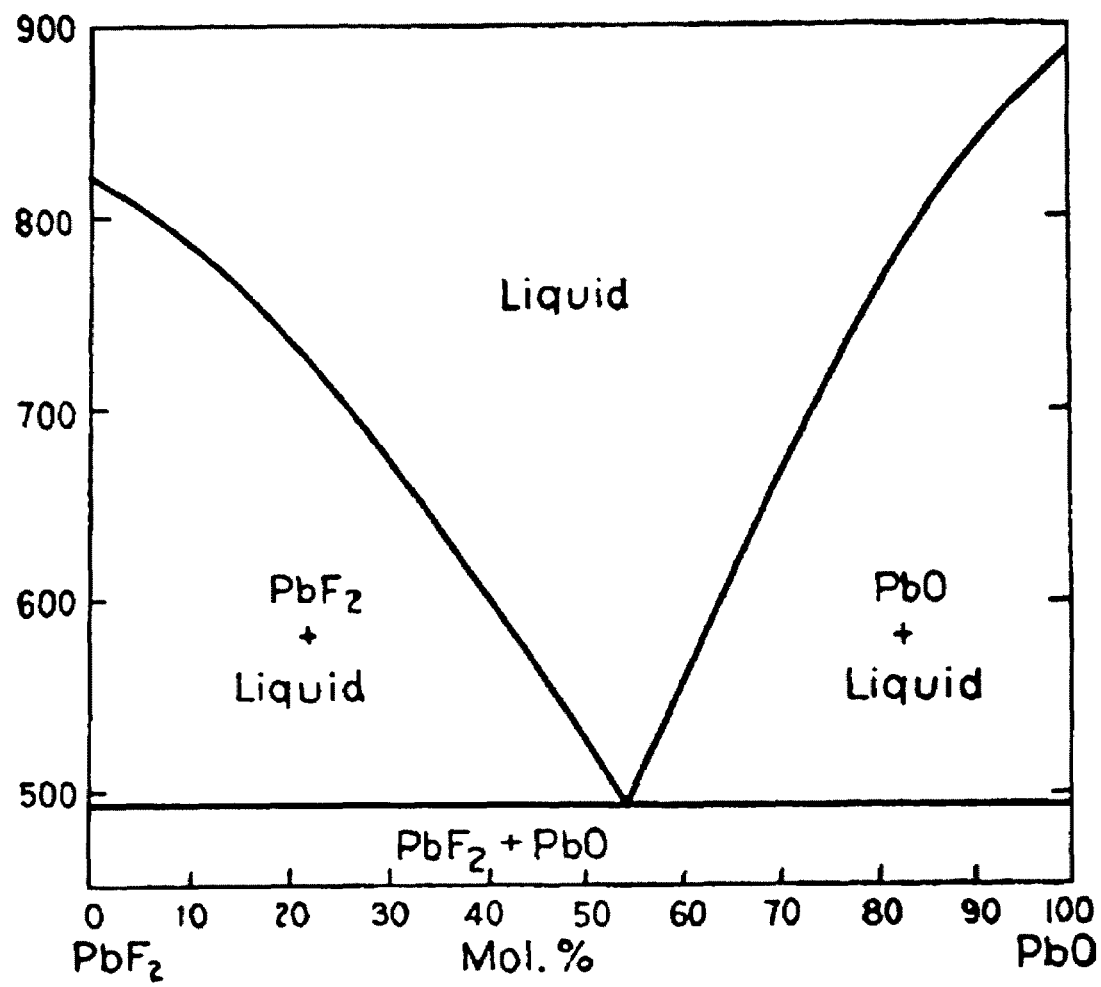
FIG. 3 is a $PbF_2$—PbO phase diagram.

FIG. 3 is a $PbF_2$—PbO phase diagram (reference document: C. Sandonnini Atti. Accad. Naz. Lincei, Cl. Sci. Fis. Mat. Nat., 23 [Ser. 5, Pt. 1] 962-964 (1914)). $PbF_2$ and PbO form an eutectic system, and the melting point can be lowered by mixing $PbF_2$ and PbO. $PbF_2$ is mixed with PbO. In the range of a $PbF_2$ concentration of about 0.01 to about 86 mol %, the melting point of the $PbF_2$+PbO mixture can be lowered to equal to or lower than the melting point of the single substance of $PbF_2$ or the single substance of PbO. This indicates that the vaporizing amount of $PbF_2$ or PbO in the above-mentioned range of the $PbF_2$ concentration can be suppressed as compared with the vaporizing amount of the single substance of $PbF_2$ or the single substance of PbO.

Figure 4:
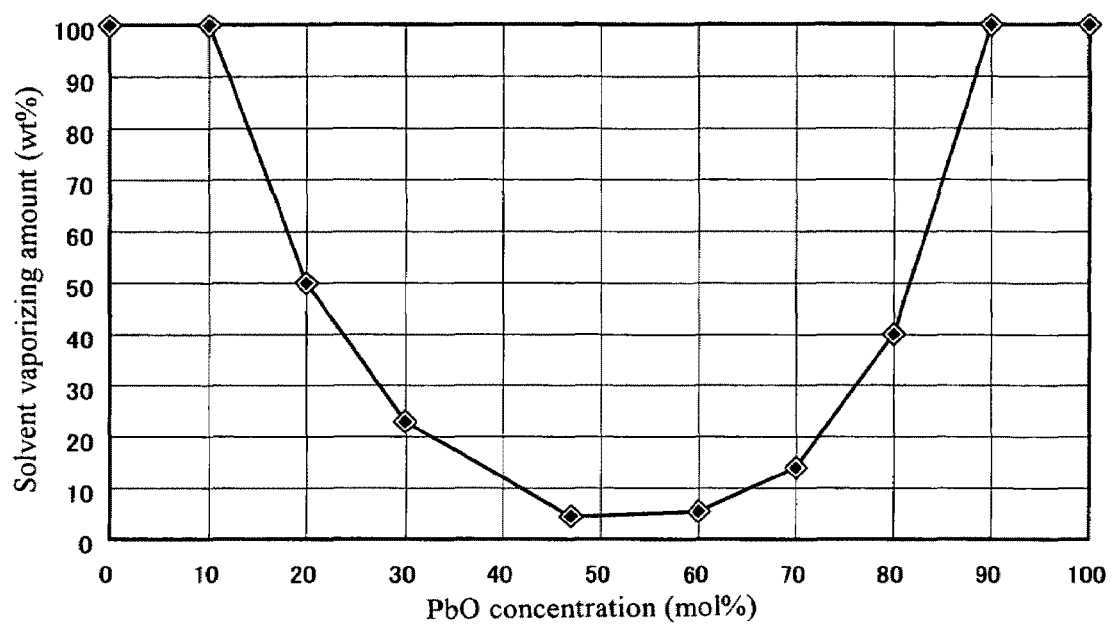
FIG. 4 shows the weight reduction degree when a $PbF_2$—PbO mixture is kept at the melting point+200° C. for 1 hour.

As a result of active studies, the present inventors obtained the results shown in FIG. 4. $PbF_2$ and PbO were mixed at an optional ratio, and the mixture was kept at the melting point+200° C. for 1 hour. The weight reduction degree was measured with Tg-DTA. FIG. 4 shows the measurement results. As is clear from the figure, in the ranges in which $PbF_2$:PbO is 100:0 to 90:10 and 10:90 to 0:100, the solvent components are all vaporized. This result indicates that the vapor pressures of $PbF_2$ and PbO are high. By contrast, when $PbF_2$ and PbO are mixed, i.e., in the range in which $PbF_2$:PbO is 80:20 to 20:80, the vaporizing amount of the $PbF_2$+PbO mixture is reduced. Based on the above results, when the mixing ratio of PbO and $PbF_2$ as the solvents is preferably PbO:$PbF_2$=(20 to 80 mol %):(80 to 20 mol %), more preferably PbO:$PbF_2$=40:60 to 60:40, the vaporizing amount of $PbF_2$+PbO as the solvents can be suppressed. As a result, the variance in the solute concentration is reduced, and so the ZnO single crystal thin film/bulk can be stably grown by the solution growth technique. In addition, the wearing of the members of the furnace can be suppressed and the growth furnace does not need to be of a sealable type. Thus, the present invention for growing a ZnO single crystal at low cost has been made.

As a result of further active studies, the present inventors found that when the mixing ratio of ZnO as the solute and $PbF_2$ and PbO as the solvents is preferably solute:solvents=(2 to 20 mol %):(98 to 80 mol %), more preferably when the ratio of the solute is 5 to 10 mol %, the ZnO single crystal thin film/bulk can be grown with the solvent components being suppressed from being vaporized. When the concentration of the solute is lower than 5 mol %, the effective growing rate is too slow; whereas when the concentration of the solute is higher than 10 mol %, the temperature for dissolving the solute components is too high and thus the vaporizing amount of the solvents may be too large.

Next, the principle of a second embodiment of the present invention will be described.

Figure 10:
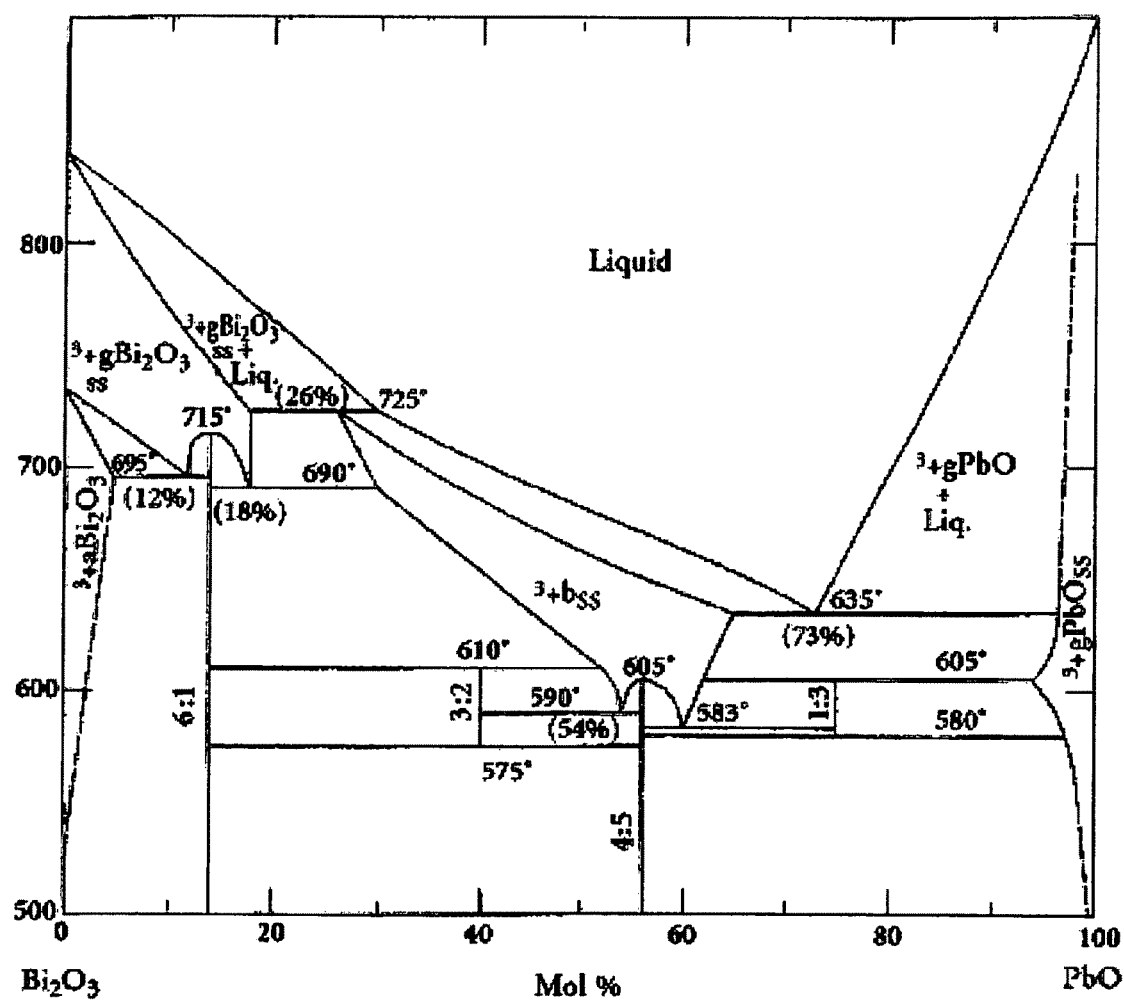
FIG. 10 is a PbO—$Bi_2O_3$ phase diagram.

FIG. 10 is a PbO—$Bi_2O_3$ phase diagram (reference document: Temperature/combination phase diagram of the system $Bi_2O_3$—PbO, J. Am. Chem. Soc., 64 [3] 182-184, 1981). PbO and $Bi_2O_3$ form an eutectic system, and the melting point can be lowered by mixing PbO and $Bi_2O_3$. PbO is mixed with $Bi_2O_3$. In the range of a PbO concentration of about 0.01 to about 95 mol %, the melting point of the PbO+$Bi_2O_3$ mixture can be lowered to equal to or lower than the melting point of the single substance of PbO or the single substance of $Bi_2O_3$. This indicates that the vaporizing amount of PbO or $Bi_2O_3$ in the above-mentioned range of the PbO concentration can be suppressed as compared with the vaporizing amount of the single substance of PbO or the single substance of $Bi_2O_3$.

As the composition of the solvents, PbO:$Bi_2O_3$=(0.1 to 95 mol %):(99.9 to 5 mol %) is preferable. More preferably, PbO:$Bi_2O_3$=(30 to 90 mol %):(70 to 10 mol %), and especially preferably, PbO:$Bi_2O_3$=(60 to 80 mol %):(40 to 20 mol %). With PbO or $Bi_2O_3$ is independently used as the solvent, the temperature for liquid phase growth is too high. Therefore, a PbO+$Bi_2O_3$ mixed solvent having the ratio as mentioned above is preferable.

The mixing ratio of ZnO as the solute and PbO and $Bi_2O_3$ as the solvents is preferably solute:solvents=(5 to 30 mol %):(95 to 70 mol %). More preferably, the ratio of the solute is 5 mol % or higher and 10 mol % or lower. When the ratio of the solute is lower than 5 mol %, the growing rate is too slow; whereas when the ratio of the solute is higher than 10 mol %, the temperature for growth may be too high.

In the first and second embodiments of the present invention, one or at least two third components may be added to the solvent in such a range that the ZnO solubility, the vaporizing amount of $PbF_2$+PbO, or the vaporizing amount of PbO+$Bi_2O_3$ is not significantly varied, for the purpose of controlling the temperature for liquid phase growth, adjusting the viscosity of the solvent and doping with a different type of chemical element. For example, $B_2O_3$, $P_2O_5$, $V_2O_5$, $MoO_3$, $WO_3$, $SiO_2$, MgO, BaO or the like may be added. $Bi_2O_3$ may be added as the third component to the solvents of the first embodiment of the present invention.

In the first and second embodiments of the present invention, ZnO can express or change the characteristic thereof by being doped with a different type of chemical element. Li, Na, K, Cs, Rb, Be, Mg, Ca, Sr, Ba, Cu, Ag, N, P, As, Sb, Bi, B, Al, Ga, In, Tl, F, Cl, Br, I, Mn, Fe, Co, Ni, Ti, Zr, Hf, V, Nb, Ta, Cr, Mo, W, lanthanoid elements or the like may be added at 20 mol % or less, preferably at 10 mol % or less, more preferably at 1 mol % or less, with respect to ZnO. In such a case, for example, ZnO becomes a p-type semiconductor, an n-type semiconductor or a magnetic semiconductor; the conductivity of ZnO is controlled; or ZnO is applied for a varistor or an electric field light emitting element.

In the first and second embodiments of the present invention, for the seed crystal or substrate, anything which has the same type of crystalline structure as that of ZnO and does not react with the grown thin film is usable. A substance having a close lattice constant to that of ZnO is preferably usable. For example, sapphire, $LiGaO_2$, $LiAlO_2$, $LiNbO_3$, $LiTaO_3$, ZnO or the like is usable. Considering that the target single crystal of the present invention is ZnO, the optimal substance is ZnO, with which the lattice alignment between the seed crystal or substrate and the grown crystal is high.

The ZnO single crystal growth techniques usable in the present invention include a liquid phase epitaxial growth technique (LPE technique), a flax technique, a TSSG technique, a solution growth technique and the like. Especially in consideration of application to a light emitting element or the like, a liquid phase homo epitaxial growth technique using a ZnO substrate, with which a function-by-function layer structure can be easily formed, is preferable.

Hereinafter, a third embodiment of the present invention will be described.

Figure 5:
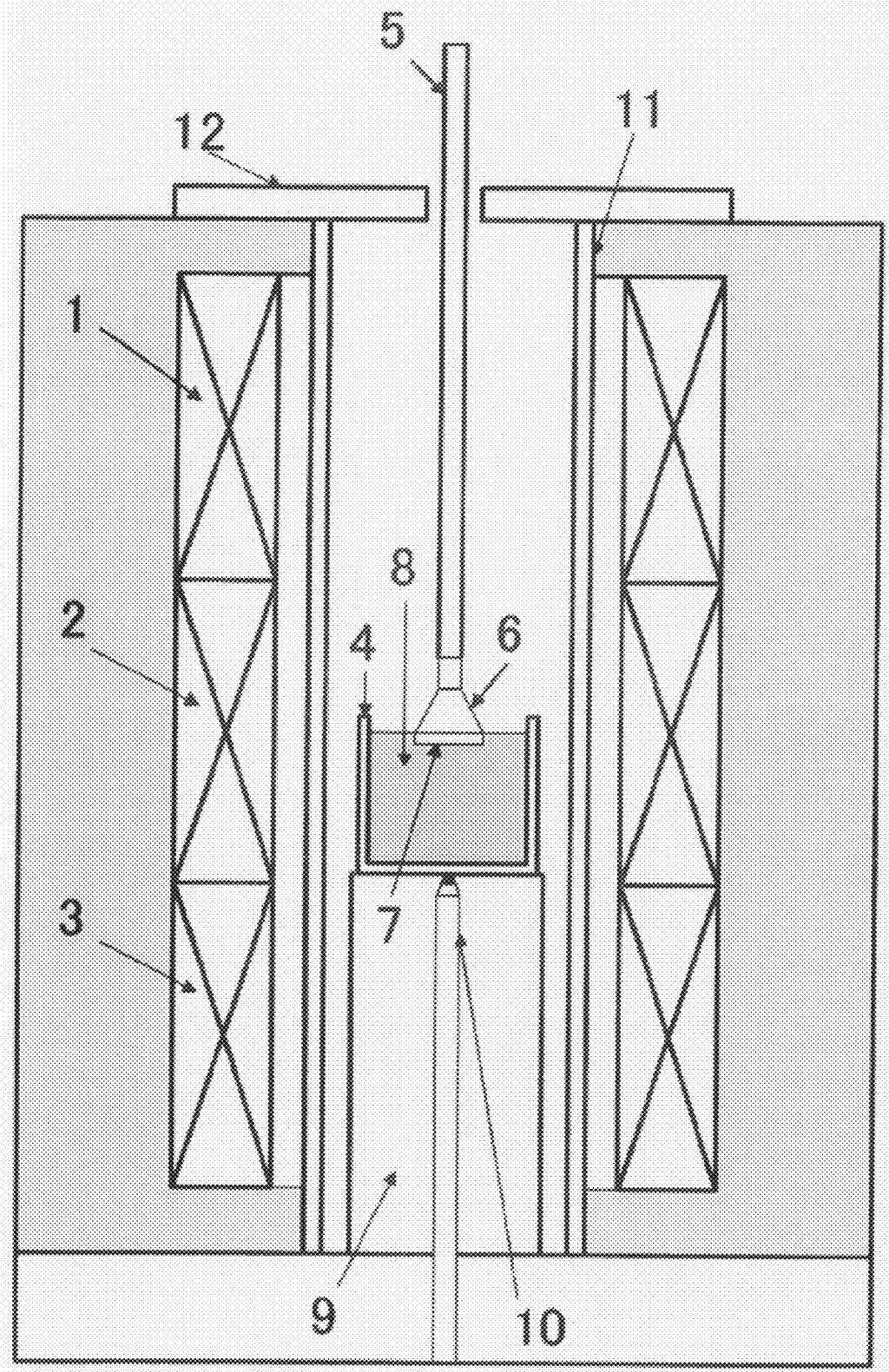
FIG. 5 is a schematic view of a ZnO single crystal production apparatus used in the present invention.

FIG. 5 shows a general LPE growth furnace (conventional example). In the LPE growth furnace, a platinum crucible 4 for dissolving a material and accommodating the material as a melted solution is placed on a crucible table 9 formed of mullite (alumina+silica). Outer to, and to the side of, the platinum crucible 4, three stage side heaters (top heater 1, central heater 2, and bottom heater 3) for heating and dissolving the material in the platinum crucible 4 are provided. Outputs of the heaters are independently controlled, and the heating amounts of the heaters for the melted solution are independently adjusted. A furnace core tube 11 formed of mullite is provided between the heaters and the inner wall of the production furnace, and a furnace lid 12 formed of mullite is provided above the furnace core tube 11. Above the platinum crucible 4, a lifting mechanism is provided. A lifting shaft 5 formed of alumina is fixed to the lifting mechanism, and a substrate holder 6 and a seed crystal or substrate 7 fixed by the holder are provided at a tip of the lifting shaft 5. Above the lifting shaft 5, a mechanism for rotating the shaft is provided.

Among the members of the LPE furnace, the crucible 9, the furnace core tube 11, the putting shaft 5 and the furnace lid 12 are conventionally formed of only alumina or mullite. It is considered that in the temperature range of 700 to 1100° C. at which the growth by the LPE technique occurs and the material is dissolved, the Al component is vaporized from alumina or mullite, dissolved in the solvent, and mixed into the ZnO single crystal thin film as a contaminant. As a result of active studies, the present inventors used a non-Al-based material as the material of the members of the LPE furnace and thus achieved the present invention for reducing the contamination, with the Al impurities, of the ZnO single crystal thin film grown by LPE.

As the non-Al-based material of the members of the furnace, ZnO is optimal. Considering that ZnO is not commercially available, MgO is preferable because MgO does not act as a carrier even if being mixed into the ZnO thin film. In consideration of the SIMS analysis results that the concentration of Si impurities in the LPE film is not increased even when mullite formed of alumina+silica is used, quarts is also preferable. Other usable materials include calcia (CaO), silica, $ZrO_2$, zircon ($ZrO_2$+$SiO_2$), SiC, $Si_3N_4$ and the like.

From the above, a preferable embodiment of the present invention is directed to a method for producing a ZnO single crystal, by which a ZnO single crystal is grown using a growth furnace formed of MgO and/or quarts as a non-Al-based material of the members of the furnace. In addition, the following embodiment is also preferable: the growth furnace includes a crucible table on which a crucible is allowed to be placed, a furnace core tube provided so as to surround an outer circumference of the crucible, a furnace lid provided above the furnace core tube for opening and closing the furnace, and a lifting shaft for moving the seed crystal or substrate up and down; and these members are independently formed of MgO or quartz.

In the third embodiment of the present invention, substances usable as the solvents for dissolving ZnO include $PbF_2$, PbO, high temperature-high pressure water, $V_2O_5$, $B_2O_3$, $MoO_3$ and the like. From the viewpoint of suppressing the vaporizing amount of the solvent or reducing the LPE temperature, eutectic-system solvents such as PbO+$PbF_2$, PbO+$Bi_2O_3$ and the like are preferable. In addition, one or at least two third components may be added to the solvent in such a range that the ZnO solubility is not significantly varied, for the purpose of controlling the temperature for liquid phase growth, adjusting the viscosity of the solvent and doping with a different type of chemical element. For example, $B_2O_3$, $P_2O_5$, $Bi_2O_3$, $V_2O_5$, $MoO_3$, $WO_3$, $SiO_2$, MgO, BaO or the like may be added.

As the seed crystal or substrate usable in the third embodiment of the present invention, any of those described in the first and second embodiments is preferably usable.

In the third embodiment of the present invention, where PbO+$PbF_2$ is used as the solvent, the solute concentration is preferably 2 mol % or higher and 20 mol % or lower, and more preferably 5 mol % or higher and 10 mol % or lower. When the solute concentration is lower than 5 mol %, the growth rate is too slow; whereas when the solute concentration is higher than 10 mol %, the temperature for growth may be too high. Where PbO+$Bi_2O_3$ is used as the solvent, the solute concentration is preferably 5 mol % or higher and 30 mol % or lower, and more preferably 5 mol % or higher and 10 mol % or lower. When the solute concentration is lower than 5 mol %, the growth rate is too slow; whereas when the solute concentration is higher than 10 mol %, the temperature for growth may be too high.

In the third embodiment of the present invention, ZnO can express or change the characteristic thereof by being doped with a different type of chemical element. Li, Na, K, Cs, Rb, Be, Mg, Ca, Sr, Ba, Cu, Ag, N, P, As, Sb, Bi, B, Al, Ga, In, Tl, F, Cl, Br, I, Mn, Fe, Co, Ni, Ti, Zr, Hf, V, Nb, Ta, Cr, Mo, W, lanthanoid elements or the like may be added at 20 mol % or less, preferably at 10 mol % or less, more preferably at 1 mol % or less, with respect to ZnO. In such a case, for example, ZnO becomes a p-type semiconductor, an n-type semiconductor or a magnetic semiconductor; the conductivity of ZnO is controlled; or ZnO is applied for a varistor or an electric field light emitting element. For producing an n-type ZnO single crystal thin film, ZnO may be doped with Al. In consideration that the Al concentration needs to be controlled, it is the Al source which should be controlled by the doping amount, and it is preferable to avoid mix Al from the growth furnace.

The embodiments of the present invention can be summarized as follows.

(1) A method for producing a ZnO single crystal by a liquid phase growth technique, wherein ZnO as a solute and $PbF_2$ and PbO as solvents are mixed and melted, and then a seed crystal or substrate is put into direct contact with the obtained melted solution, thereby growing a ZnO single crystal on the seed crystal or substrate.

(2) The method according to (1), wherein the mixing ratio of ZnO with respect to $PbF_2$ and PbO as the solvents is solute:solvent=2 to 20 mol %:98 to 80 mol %, and the mixing ratio of $PbF_2$ and PbO as the solvents is $PbF_2$:PbO=20 to 80 mol %:80 to 20 mol %.

(3) A method for producing a ZnO single crystal by a liquid phase growth technique, wherein ZnO as a solute and PbO and $Bi_2O_3$ as solvents are mixed and melted, and then a seed crystal or substrate is put into direct contact with the obtained melted solution, thereby growing a ZnO single crystal on the seed crystal or substrate.

(4) The method according to (3), wherein the mixing ratio of ZnO with respect to PbO and $Bi_2O_3$ as the solvents is solute:solvent=5 to 30 mol %:95 to 70 mol %, and the mixing ratio of PbO and $Bi_2O_3$ as the solvents is PbO:$Bi_2O_3$=0.1 to 95 mol %:99.9 to 5 mol %.

(5) The method according to any one of (1) through (4), wherein the ZnO single crystal contains a trace amount of different type of chemical element.

(6) The method according to (5), wherein the trace amount of different type of chemical element is 1 mol % or less of different type of chemical element.

(7) The method according to (5) or (6), wherein the different type of chemical element is one or at least two selected from the group consisting of Li, Na, K, Cs, Rb, Be, Mg, Ca, Sr, Ba, Cu, Ag, N, P, As, Sb, Bi, B, Al, Ga, In, Tl, F, Cl, Br, I, Mn, Fe, Co, Ni, Ti, Zr, Hf. V, Nb, Ta, Cr, Mo, W, and lanthanoid elements.

(8) A method for producing a ZnO single crystal by a liquid phase growth technique by which ZnO as a solute is melted in a solvent, and then a seed crystal or substrate is put into direct contact with the obtained melted solution, thereby growing a ZnO single crystal on the seed crystal or substrate, wherein the ZnO single crystal is grown using a growth furnace formed of a non-Al-based material.

(9) The method according to (8), wherein the non-Al-based material is MgO and/or quartz.

(10) The method according to (8), wherein the growth furnace includes a crucible table on which a crucible is allowed to be placed, a furnace core tube provided so as to surround an outer circumference of the crucible table, a furnace lid provided above the furnace core tube for opening and closing the furnace, and a lifting shaft for lifting the crucible, which are independently formed of MgO or quartz.

EXAMPLES

Hereinafter, as a method for growing a ZnO single crystal according to the first embodiment of the present invention, a method for producing a ZnO thin film on a ZnO substrate single crystal will be described. The present invention is not limited by the following examples in any way.

An embodiment of the present invention in which $PbF_2$ and PbO are used as the solvents will be described in Examples 1 through 5 and a comparative example thereto will be described in Comparative Example 1.

FIG. 5 shows a structure of the furnace used here.

In the single crystal production furnace, a platinum crucible 4 for dissolving a material and accommodating the material as a melted solution is placed on a crucible table 9. Outer to, and to the side of, the platinum crucible 4, three stage side heaters (top heater 1, central heater 2, and bottom heater 3) for heating and dissolving the material in the platinum crucible 4 are provided. Outputs of the heaters are independently controlled, and the heating amounts of the heaters for the melted solution are independently adjusted. A furnace core tube 11 is provided between the heaters and the inner wall of the production furnace, and a furnace lid 12 for opening and closing the production furnace is provided above the furnace core tube 11. Above the platinum crucible 4, a lifting mechanism is provided. A lifting shaft 5 formed of alumina is fixed to the lifting mechanism, and a substrate holder 6 and a seed crystal or substrate 7 fixed by the holder are provided at a tip of the lifting shaft 5. Above the lifting shaft 5 of alumina, a mechanism for rotating the lifting shaft 5 is provided. Below the platinum crucible 4, a thermocouple 10 for dissolving the material in the crucible is provided.

In order to dissolve the material in the platinum crucible, the temperature of the production furnace is increased to the temperature at which the material is dissolved. The temperature is preferably increased to 650 to 1000° C., more preferably to 700 to 900° C., and then the furnace is left still for 2 to 3 hours to stabilize the melted solution of the material. At this point, the three stage heaters are offset such that the temperature at the bottom of the crucible is higher by several degrees than the temperature of the surface of the melted solution.

Preferably, −100° C.≦H1 offset≦0° C., 0° C.≦H3 offset≦100° C. More preferably, −50° C.≦H1 offset≦0° C., 0° C.≦H3 offset≦50° C. The bottom of the crucible is adjusted to have a seeding temperature 700 to 900° C. After the temperature of the melted solution is stabilized, the lifting shaft is moved down while the seed crystal or the seed crystal substrate is rotated at 5 to 120 rpm, and thus the seed crystal or the seed crystal substrate is put into contact with the surface of the melted solution. After the seed crystal or the seed crystal substrate is properly coated with the melted solution, a ZnO single crystal thin film/bulk as the production target is grown on the seed crystal or the seed crystal substrate while the temperature is kept constant or is decreased at a rate of 0.025 to 1.0° C./hr. During the growth, the seed crystal or the seed crystal substrate is still rotated at 5 to 300 rpm by the rotation of the lifting shaft, and the rotation direction is reversed at a constant cycle. After the crystal is grown for about 30 minutes to 24 hours, the seed crystal or the seed crystal substrate is separated from the melted solution, and the lifting shaft is rotated at a high rate of about 200 to 300 rpm to separate the melted solution component. Then, the crystal is cooled down to room temperature over 1 to 24 hours. Thus, the target ZnO single crystal thin film is obtained.

Example 1

Figure 6:
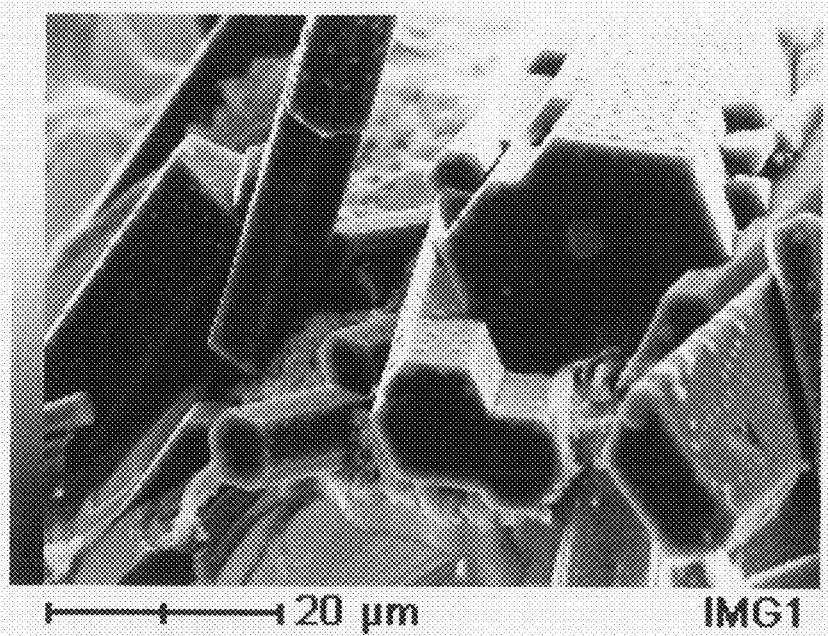
FIG. 6 is an SEM photograph of ZnO microcrystals obtained in Example 1.
Figure 7:
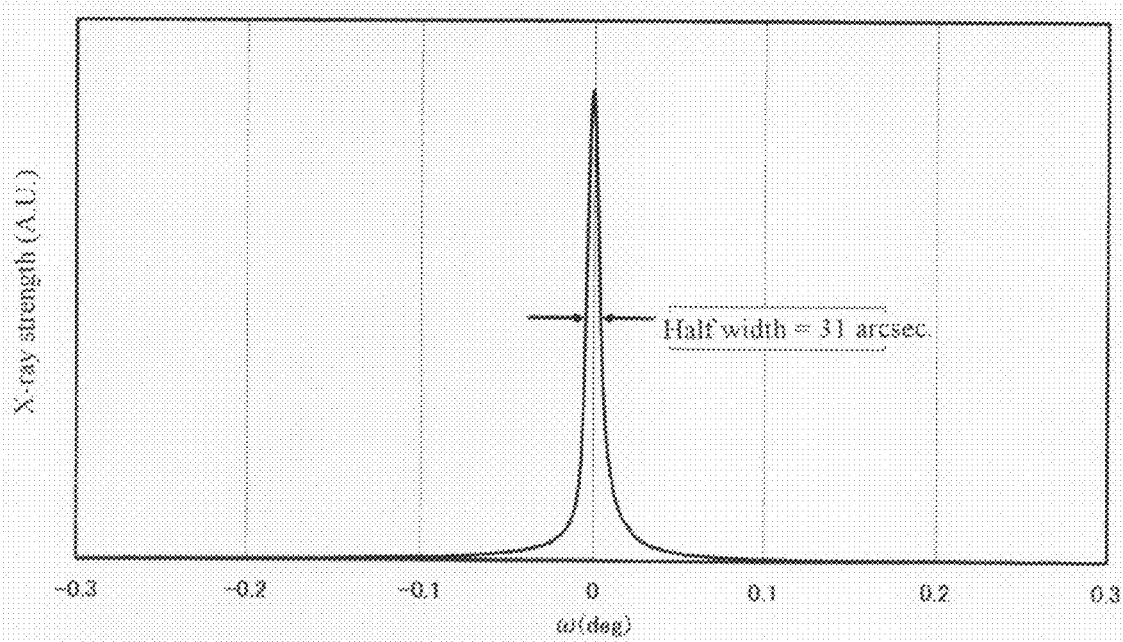
FIG. 7 shows an X-ray rocking curve of the (002) face of a ZnO single crystal film obtained in Example 2.

A ZnO single crystal was produced by a TSSG technique. Into a platinum crucible having an inner diameter of 75 mmφ, a height of 75 mmh and a thickness of 1 mm, ZnO, $PbF_2$ and PbO as materials were put in respective amounts of 50.56 g, 922.58 g and 754.87 g. In this case, the concentration of ZnO as the solute is about 8 mol %, and the concentration ratio of $PbF_2$:PbO as the solvents is about 47.3 mol %:52.7 mol %. The crucible accommodating the materials was set in the furnace shown in FIG. 5, and the materials were dissolved with the temperature at the bottom of the crucible being about 1000° C. The materials were kept at this temperature for 3 hours and then cooled until the temperature at the bottom of the crucible became 900° C. Then, a platinum block as the seed crystal was put into contact with the melted solution, and the crystal was grown at this temperature for 6 hours while the alumina lifting shaft was rotated at 60 rpm. In this step, the rotation direction of the shaft was reversed every 5 minutes. The temperature was kept for 12 hours, and the alumina lifting shaft was lifted to be separated from the melted solution. Colorless, transparent ZnO single microcrystals were obtained at a tip of the platinum block. FIG. 6 shows an SEM photograph of the microcrystals. As is clear from the figure, it is confirmed that plate-like or hexagonal column-like ZnO single crystals have been grown. During the growth, the vaporizing amount of the solvents was about 10 wt %.

Example 2

Figure 8:
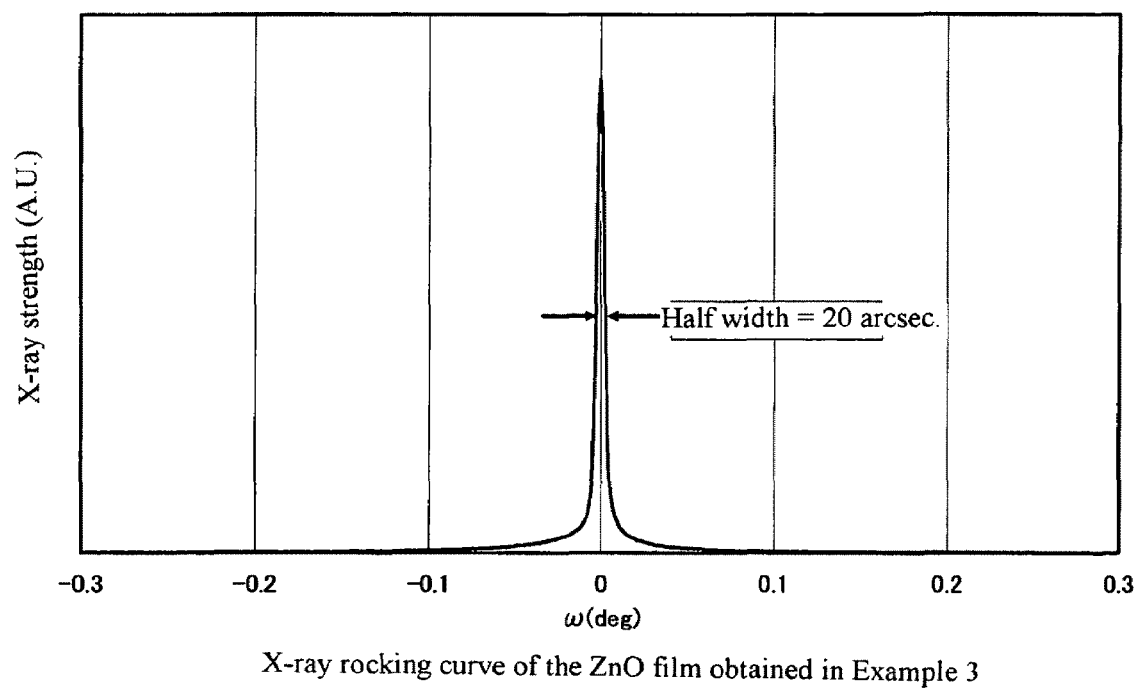
FIG. 8 shows an X-ray rocking curve of the (002) face of a ZnO single crystal film obtained in Example 3.

A ZnO single crystal was produced by a liquid phase epitaxial growth (LPE) technique. Into a platinum crucible having an inner diameter of 75 mmφ, a height of 75 mmh and a thickness of 1 mm, ZnO, $PbF_2$ and PbO as materials were put in respective amounts of 32.24 g, 922.58 g and 839.88 g. In this case, the concentration of ZnO as the solute is about 5 mol %, and the concentration ratio of $PbF_2$:PbO as the solvents is about 50.0 mol %:50.0 mol %. The crucible accommodating the materials was set in the furnace shown in FIG. 5, and the materials were dissolved with the temperature at the bottom of the crucible being about 940° C. The materials were kept at this temperature for 3 hours and then cooled until the temperature at the bottom of the crucible became about 835° C. Then, a ZnO single crystalline substrate grown by a hydrothermal technique and having a size of 10 mm×10 mm×0.5 mmt with a C face was, as a seed crystal, put into contact with the melted solution, and the crystal was grown at this temperature for 6 hours while the alumina lifting shaft was rotated at 60 rpm. In this step, the rotation direction of the shaft was reversed every 5 minutes. Then, the alumina lifting shaft was lifted to be separated from the melted solution, and was rotated at 200 rpm to shake off the melted solution component. Thus, a colorless, transparent ZnO single crystal thin film was obtained. The growth rate was about 18 μm/hr. FIG. 8 shows the measurement results of the rocking curve of the (002) face of the obtained film. The half width of the rocking curve was about 31 arcsec., which shows good crystallinity. During the growth, the vaporizing amount of the solvents was about 5 wt %.

Example 3

A ZnO single crystal was produced by a liquid phase epitaxial growth (LPE) technique. Into a platinum crucible having an inner diameter of 75 mmφ, a height of 75 mmh and a thickness of 1 mm, ZnO, $PbF_2$ and PbO as materials were put in respective amounts of 12.50 g, 922.58 g and 839.88 g. In this case, the concentration of ZnO as the solute is about 2 mol %, and the concentration ratio of $PbF_2$:PbO as the solvents is about 50.0 mol %:50.0 mol %. The crucible accommodating the materials was set in the furnace shown in FIG. 5, and the materials were dissolved with the temperature at the bottom of the crucible being about 830° C. The materials were kept at this temperature for 3 hours and then cooled until the temperature at the bottom of the crucible became 725° C. Then, a ZnO single crystalline substrate grown by a hydrothermal technique and having a size of 10 mm×10 mm×0.5 mmt with a C face was, as a seed crystal, put into contact with the melted solution, and the crystal was grown at this temperature for 6 hours while the alumina lifting shaft was rotated at 60 rpm. In this step, the rotation direction of the shaft was reversed every 5 minutes. Then, the alumina lifting shaft was lifted to be separated from the melted solution, and was rotated at 200 rpm to shake off the melted solution component. Thus, a colorless, transparent ZnO single crystal thin film was obtained. The growth rate was about 13 μm/hr. The half width of the rocking curve was about 20 arcsec., which shows good crystallinity. During the growth, the vaporizing amount of the solvents was about 2 wt %.

Example 4

A ZnO single crystal was produced by a liquid phase epitaxial growth (LPE) technique. Into a platinum crucible having an inner diameter of 75 mmφ, a height of 75 mmh and a thickness of 1 mm, ZnO, $Li_2CO_3$, $PbF_2$ and PbO as materials were put in respective amounts of 32.24 g, 0.13 g, 922.58 g and 839.88 g. In this case, the concentration of ZnO as the solute is about 5 mol %, the concentration ratio of ZnO:$Li_2CO_3$ is about 99.56 mol %:0.44 mol %, and the concentration ratio of $PbF_2$:PbO as the solvents is about 50.0 mol %:50.0 mol %. The crucible accommodating the materials was set in the furnace shown in FIG. 5, and the materials were dissolved with the temperature at the bottom of the crucible being about 930° C. The materials were kept at this temperature for 3 hours and then cooled until the temperature at the bottom of the crucible became 826° C. Then, a ZnO single crystalline substrate grown by a hydrothermal technique and having a size of 10 mm×10 mm×0.5 mmt with a C face was, as a seed crystal, put into contact with the melted solution, and the crystal was grown at this temperature for 6 hours while the alumina lifting shaft was rotated at 60 rpm. In this step, the rotation direction of the shaft was reversed every 5 minutes. Then, the alumina lifting shaft was lifted to be separated from the melted solution, and was rotated at 200 rpm to shake off the melted solution component. Thus, a colorless, transparent ZnO single crystal thin film was obtained. The growth rate was about 10 μm/hr. The half width of the rocking curve of the (002) face of the obtained film was about 35 arcsec., which shows good crystallinity. During the growth, the vaporizing amount of the solvents was about 3 wt %.

Example 5

A ZnO single crystal was produced by a liquid phase epitaxial growth (LPE) technique. Into a platinum crucible having an inner diameter of 75 mmφ, a height of 75 mmh and a thickness of 1 mm, ZnO, $PbF_2$, PbO and $B_2O_3$ as materials were put in respective amounts of 32.24 g, 768.51 g, 699.62 g and 87.49 g. In this case, the concentration of ZnO as the solute is about 5 mol %, and the concentration ratio of $PbF_2$:PbO:$B_2O_3$ as the solvents is about 41.65 mol %:41.65 mol %:16.70 mol %. The crucible accommodating the materials was set in the furnace shown in FIG. 5, and the materials were dissolved with the temperature at the bottom of the crucible being about 920° C. The materials were kept at this temperature for 3 hours and then cooled until the temperature at the bottom of the crucible became 815° C. Then, a ZnO single crystalline substrate grown by a hydrothermal technique and having a size of 10 mm×10 mm×0.5 mmt with a C face was, as a seed crystal, put into contact with the melted solution, and the crystal was grown at this temperature for 6 hours while the alumina lifting shaft was rotated at 60 rpm. In this step, the rotation direction of the shaft was reversed every 5 minutes. Then, the alumina lifting shaft was lifted to be separated from the melted solution, and was rotated at 200 rpm to shake off the melted solution component. Thus, a colorless, transparent ZnO single crystal thin film was obtained. The growth rate was about 15 μm/hr. The half width of the rocking curve was about 25 arcsec., which shows good crystallinity. During the growth, the vaporizing amount of the solvents was about 3 wt %.

Comparative Example 1

A ZnO single crystal was produced by a liquid phase epitaxial growth (LPE) technique. Into a platinum crucible having an inner diameter of 75 mmφ, a height of 75 mmh and a thickness of 1 mm, ZnO and $PbF_2$ as materials were put in respective amounts of 64.60 g and 1751.76 g. In this case, the concentration of ZnO as the solute is about 10 mol %, and the concentration of $PbF_2$ as the solvent is 100 mol %. The crucible accommodating the materials was set in the furnace shown in FIG. 5, and the materials were dissolved with the temperature at the bottom of the crucible being about 870° C. The materials were kept at this temperature for 3 hours and then cooled until the temperature at the bottom of the crucible became about 765° C. Then, a ZnO single crystalline substrate grown by a hydrothermal technique and having a size of 10 mm×10 mm×0.5 mmt with a C face was, as a seed crystal, put into contact with the melted solution, and the crystal was grown at this temperature for 6 hours while the alumina lifting shaft was rotated at 60 rpm. In this step, the rotation direction of the shaft was reversed every 5 minutes. Then, the alumina lifting shaft was lifted to be separated from the melted solution, and was rotated at 200 rpm to shake off the melted solution component. Thus, a colorless, transparent ZnO single crystal thin film was obtained. The obtained ZnO single crystal film was observed with a microscope. It was found that many needle-like crystals were deposited in addition to the LPE film. This is considered to have occurred because the vaporization of the solvent increased the concentration of the solute and thus crystals nucleated spontaneously in portions other than the substrate adhered to the substrate. During the growth, the vaporizing amount of the solvent was about 25 wt %.

temperature 800 to 1060° C. After the temperature of the melted solution is stabilized, the lifting shaft is moved down while the seed crystal or the seed crystal substrate is rotated at 5 to 120 rpm, and thus the seed crystal or the seed crystal substrate is put into contact with the surface of the melted solution. After the seed crystal or the seed crystal substrate is properly coated with the melted solution, a ZnO single crystal thin film/bulk as the production target is grown on the seed crystal or the seed crystal substrate while the temperature is kept constant or is decreased at a rate of 0.025 to 1.0° C./hr. During the growth, the seed crystal or the seed crystal sub-

TABLE 1

| | Growth technique | ZnO concentration mol % | Doping Compound | mol % (with respect to ZnO) | Solvent composition (mol %) PbF$_2$ | PbO | B$_2$O$_3$ | Dissolution temperature ° C. | Seeding temperature ° C. | Growth rate μm/hr | Solvent vaporizing amount wt % |
|---|---|---|---|---|---|---|---|---|---|---|---|
| Example 1 | TSSG | 8 | — | — | 47.30 | 52.70 | — | 1000 | 900 | — | 10 |
| Example 2 | LPE | 5 | — | — | 50.00 | 50.00 | — | 940 | 835 | 18 | 5 |
| Example 3 | LPE | 2 | — | — | 50.00 | 50.00 | — | 830 | 725 | 13 | 2 |
| Example 4 | LPE | 5 | Li$_2$CO$_3$ | 0.44 | 50.00 | 50.00 | — | 930 | 826 | 10 | 3 |
| Example 5 | LPE | 5 | — | — | 41.65 | 41.65 | 16.70 | 920 | 815 | 15 | 3 |
| Comparative Example 1 | LPE | 10 | — | — | 100.0 | 0.0 | — | 870 | 765 | — | 25 |

As described above, a ZnO single crystal can be produced on a seed crystal or substrate by a liquid phase growth technique by mixing and melting ZnO as the solute and PbF$_2$ and PbO as the solvents and then putting the seed crystal or substrate into direct contact with the obtained melted solution. By this method, the vaporizing amount of the solvents can be suppressed and so the variance in the composition is reduced, and therefore stable crystal growth is realized. Also by this method, the wearing of the members of the furnace can be suppressed and so the growth furnace does not need to be of a sealable type, and therefore the ZnO single crystal can be produced at low cost. Since the solution growth technique is used as the crystal growth technique, a high quality ZnO single crystal with very few dislocations and defects can be produced. The ZnO single crystal obtained by the present invention is colorless and transparent and has a high level of crystallinity, and therefore is usable for electronic materials and devices using ZnO, which are expected to be developed in the future.

Now, an embodiment of the present invention in which PbO and Bi$_2$O$_3$ as the solvents will be described in Examples 6 through 10 and comparative examples thereto will be described in Comparative Examples 2 and 3.

The furnace used in these examples and comparative examples is the same as that used in Examples 1 through 5, but some conditions including the temperature are slightly different as described below.

In order to dissolve the material in the Pt crucible, the temperature of the production furnace is increased to the temperature at which the material is dissolved. The temperature is preferably increased to 800 to 1100° C., and then the melted solution of the material is stirred by a Pt stirring jig for 1 to 3 hours to be uniformly dissolved. At this point, the three stage heaters are offset such that the temperature at the bottom of the crucible is higher by several degrees than the temperature of the surface of the melted solution. Preferably, −100° C.≦H1 offset≦0° C., 0° C.≦H3 offset≦100° C. More preferably, −50° C.≦H1 offset≦0° C., 0° C.≦H3 offset≦50° C. The bottom of the crucible is adjusted to have a seeding strate is still rotated at 5 to 300 rpm by the rotation of the lifting shaft, and the rotation direction is reversed at a constant cycle. After the crystal is grown for about 30 minutes to 24 hours, the seed crystal or the seed crystal substrate is separated from the melted solution, and the lifting shaft is rotated at a high rate of about 200 to 300 rpm to separate the melted solution component. Then, the crystal is cooled down to room temperature over 1 to 24 hours. Thus, the target ZnO single crystal thin film is obtained.

Reference Example 1

Figure 1:
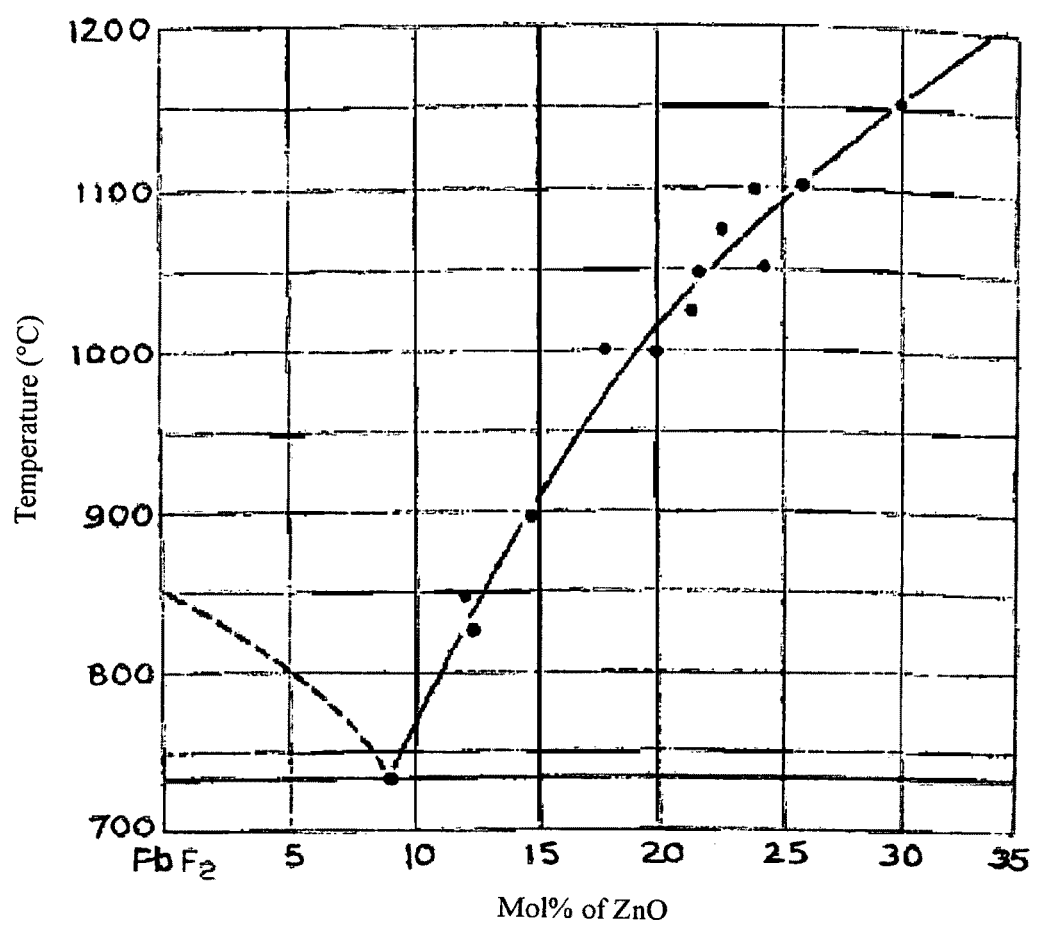
FIG. 1 is a $PbF_2$—ZnO phase diagram.
Figure 2:
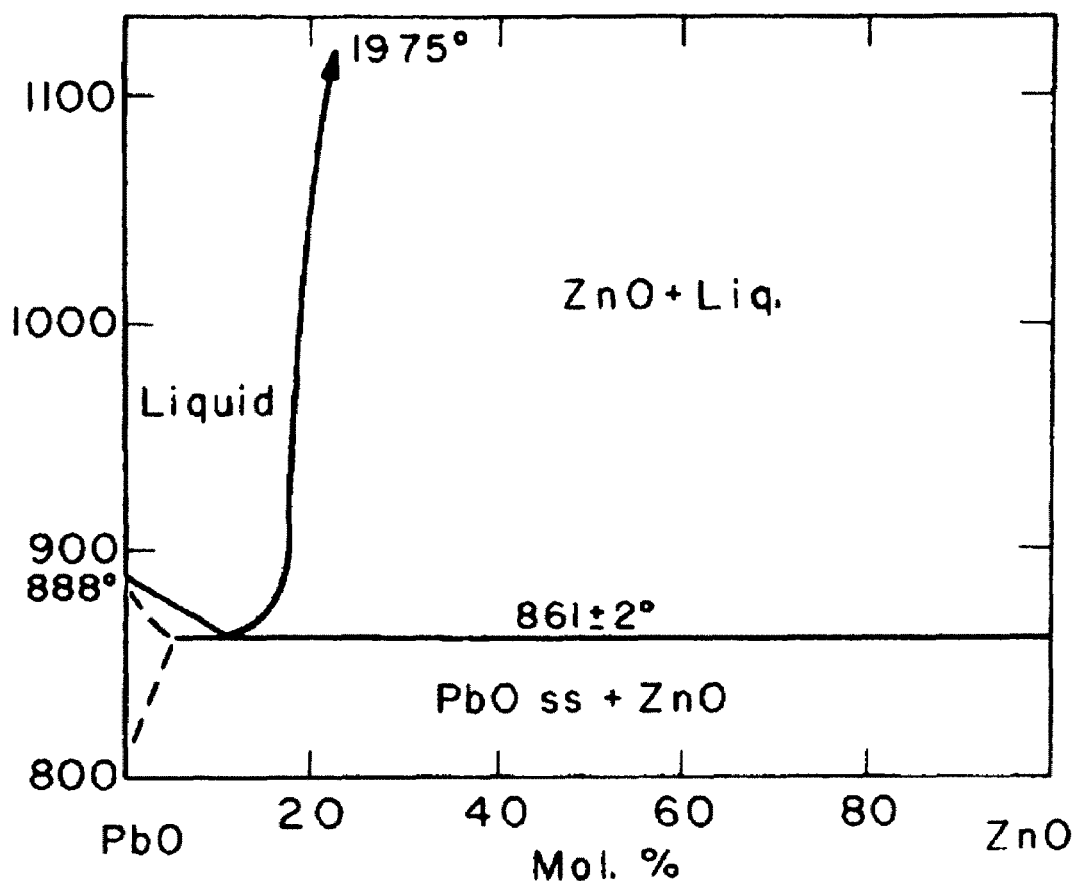
FIG. 2 is a PbO—ZnO phase diagram.

A colorless, transparent ZnO single crystal thin film was obtained by substantially the same method as in Example 2. This was set as Reference Example 1. The half width of the rocking curve of the (002) face of the obtained film was about 31 arcsec., which shows good crystallinity. FIG. 2 shows the results of impurity analysis conducted by dynamic SIMS.

Example 6

A ZnO single crystal was produced by a liquid phase epitaxial growth (LPE) technique. Into a platinum crucible having an inner diameter of 75 mmφ, a height of 75 mmh and a thickness of 1 mm, ZnO, PbO and Bi$_2$O$_3$ as materials were put in respective amounts of 63.63 g, 1511.39 g and 123.61 g. In this case, the concentration of ZnO as the solute is about 10 mol %, and the concentration ratio of PbO:Bi$_2$O$_3$=96.23 mol %:3.77 mol %. The crucible accommodating the materials was set in the furnace shown in FIG. 5, and the materials were kept for 1 hour with the temperature at the bottom of the crucible being about 1100° C. and were stirred by a Pt stirring jig to be dissolved. The materials were then cooled until the temperature at the bottom of the crucible became about 1055° C. Then, a ZnO single crystalline substrate grown by a hydrothermal technique and having a size of 10 mm×10 mm×0.5 mmt with a C face was, as a seed crystal, put into contact with the melted solution, and the crystal was grown at this temperature for 6 hours while the alumina lifting shaft was rotated at 30 rpm. In this step, the rotation direction of the shaft was reversed every 2 minutes. Then, the alumina lifting shaft was lifted to be separated from the melted solution, and was rotated at 100 rpm to shake off the melted solution component. Thus, a colorless, transparent ZnO single crystal thin film was obtained. The growth rate was about 30 μm/hr. The half width of the rocking curve of the (002) face of the obtained film was about 31 arcsec., which shows good crystallinity. Table 2 shows the results of impurity analysis conducted by dynamic SIMS. As compared with Reference Example 1, the strength of F (fluorine) is significantly reduced.

Example 7

A ZnO single crystal was produced by a liquid phase epitaxial growth (LPE) technique. Into a platinum crucible having an inner diameter of 75 mmϕ, a height of 75 mmh and a thickness of 1 mm, ZnO, PbO and $Bi_2O_3$ as materials were put in respective amounts of 60.52 g, 1363.72 g and 271.28 g. In this case, the concentration of ZnO as the solute is about 10 mol %, and the concentration ratio of PbO:$Bi_2O_3$=91.30 mol %:8.70 mol %. The crucible accommodating the materials was set in the furnace shown in FIG. 5, and the materials were kept for 1 hour with the temperature at the bottom of the crucible being about 1060° C. and were stirred by a Pt stirring jig to be dissolved. The materials were then cooled until the temperature at the bottom of the crucible became about 1013° C. Then, a ZnO single crystalline substrate grown by a hydrothermal technique and having a size of 10 mm×10 mm×0.5 mmt with a C face was, as a seed crystal, put into contact with the melted solution, and the crystal was grown at this temperature for 6 hours while the alumina lifting shaft was rotated at 30 rpm. In this step, the rotation direction of the shaft was reversed every 2 minutes. Then, the alumina lifting shaft was lifted to be separated from the melted solution, and was rotated at 100 rpm to shake off the melted solution component. Thus, a colorless, transparent ZnO single crystal thin film was obtained. The growth rate was about 20 μm/hr. The half width of the rocking curve of the (002) face of the obtained film was about 27 arcsec., which shows good crystallinity. Table 2 shows the results of impurity analysis conducted by dynamic SIMS. As compared with Reference Example 1, the strength of F (fluorine) is significantly reduced.

Example 8

A ZnO single crystal was produced by a liquid phase epitaxial growth (LPE) technique. Into a platinum crucible having an inner diameter of 75 mmϕ, a height of 75 mmh and a thickness of 1 mm, ZnO, PbO and $Bi_2O_3$ as materials were put in respective amounts of 55.55 g, 1128.39 g and 506.61 g. In this case, the concentration of ZnO as the solute is about 10 mol %, and the concentration ratio of PbO:$Bi_2O_3$=82.30 mol %:17.70 mol %. The crucible accommodating the materials was set in the furnace shown in FIG. 5, and the materials were kept for 1 hour with the temperature at the bottom of the crucible being about 1000° C. and were stirred by a Pt stirring jig to be dissolved. The materials were then cooled until the temperature at the bottom of the crucible became about 955° C. Then, a ZnO single crystalline substrate grown by a hydrothermal technique and having a size of 10 mm×10 mm×0.5 mmt with a C face was, as a seed crystal, put into contact with the melted solution, and the crystal was grown at this temperature for 6 hours while the alumina lifting shaft was rotated at 30 rpm. In this step, the rotation direction of the shaft was reversed every 2 minutes. Then, the alumina lifting shaft was lifted to be separated from the melted solution, and was rotated at 100 rpm to shake off the melted solution component. Thus, a colorless, transparent ZnO single crystal thin film was obtained. The growth rate was about 15 μm/hr. The half width of the rocking curve of the (002) face of the obtained film was about 24 arcsec., which shows good crystallinity. Table 2 shows the results of impurity analysis conducted by dynamic SIMS. As compared with Reference Example 1, the strength of F (fluorine) is significantly reduced.

Example 9

A ZnO single crystal was produced by a liquid phase epitaxial growth (LPE) technique. Into a platinum crucible having an inner diameter of 75 mmϕ, a height of 75 mmh and a thickness of 1 mm, ZnO, PbO and $Bi_2O_3$ as materials were put in respective amounts of 48.63 g, 800.61 g and 834.39 g. In this case, the concentration of ZnO as the solute is about 10 mol %, and the concentration ratio of PbO:$Bi_2O_3$=66.70 mol %:33.30 mol %. The crucible accommodating the materials was set in the furnace shown in FIG. 5, and the materials were kept for 1 hour with the temperature at the bottom of the crucible being about 950° C. and were stirred by a Pt stirring jig to be dissolved. The materials were then cooled until the temperature at the bottom of the crucible became about 898° C. Then, a ZnO single crystalline substrate grown by a hydrothermal technique and having a size of 10 mm×10 mm×0.5 mmt with a C face was, as a seed crystal, put into contact with the melted solution, and the crystal was grown at this temperature for 6 hours while the alumina lifting shaft was rotated at 30 rpm. In this step, the rotation direction of the shaft was reversed every 2 minutes. Then, the alumina lifting shaft was lifted to be separated from the melted solution, and was rotated at 100 rpm to shake off the melted solution component. Thus, a colorless, transparent ZnO single crystal thin film was obtained. The growth rate was about 2 μm/hr. The half width of the rocking curve of the (002) face of the obtained film was about 21 arcsec., which shows good crystallinity. Table 2 shows the results of impurity analysis conducted by dynamic SIMS. As compared with Reference Example 1, the strength of F (fluorine) is significantly reduced.

Example 10

A ZnO single crystal was produced by a liquid phase epitaxial growth (LPE) technique. Into a platinum crucible having an inner diameter of 75 mmϕ, a height of 75 mmh and a thickness of 1 mm, ZnO, PbO and $Bi_2O_3$ as materials were put in respective amounts of 32.94 g, 800.61 g and 834.39 g. In this case, the concentration of ZnO as the solute is about 7 mol %, and the concentration ratio of PbO:$Bi_2O_3$=66.70 mol %:33.30 mol %. The crucible accommodating the materials was set in the furnace shown in FIG. 5, and the materials were kept for 1 hour with the temperature at the bottom of the crucible being about 840° C. and were stirred by a Pt stirring jig to be dissolved. The materials were then cooled until the temperature at the bottom of the crucible became about 786° C. Then, a ZnO single crystalline substrate grown by a hydrothermal technique and having a size of 10 mm×10 mm×0.5 mmt with a C face was, as a seed crystal, put into contact with the melted solution, and the crystal was grown at this temperature for 6 hours while the alumina lifting shaft was rotated at 30 rpm. In this step, the rotation direction of the shaft was reversed every 2 minutes. Then, the alumina lifting shaft was lifted to be separated from the melted solution, and was rotated at 100 rpm to shake off the melted solution component. Thus, a colorless, transparent ZnO single crystal thin film was obtained. The growth rate was about 2 μM/hr. The half width of the rocking curve of the (002) face of the obtained film was about 21 arcsec., which shows good crystallinity. Table 2 shows the results of impurity analysis conducted by dynamic SIMS. As compared with Reference Example 1, the strength of F (fluorine) is significantly reduced.

Comparative Example 2

A ZnO single crystal was produced by a liquid phase epitaxial growth (LPE) technique. Into a platinum crucible having an inner diameter of 75 mmϕ, a height of 75 mmh and a thickness of 1 mm, ZnO and PbO as materials were put in respective amounts of 31.38 g and 1635 g. In this case, the concentration of ZnO as the solute is about 5 mol %, and the concentration ratio of $PbO:Bi_2O_3$=100 mol %:0 mol %. The crucible accommodating the materials was set in the furnace shown in FIG. 5, and the materials were kept for 1 hour with the temperature at the bottom of the crucible being about 930° C. and were stirred by a Pt stirring jig to be dissolved. The materials were then cooled until the temperature at the bottom of the crucible became about 882° C. Then, a ZnO single crystalline substrate grown by a hydrothermal technique and having a size of 10 mm×10 mm×0.5 mmt with a C face was, as a seed crystal, put into contact with the melted solution, and the crystal was grown at this temperature for 6 hours while the alumina lifting shaft was rotated at 30 rpm. In this step, the rotation direction of the shaft was reversed every 2 minutes. Then, the alumina lifting shaft was lifted to be separated from the melted solution, and was rotated at 100 rpm to shake off the melted solution component. Thus, a colorless, transparent ZnO single crystal thin film was obtained. The growth rate was about 6 μm/hr. The half width of the rocking curve of the (002) face of the obtained film was about 48 arcsec., which shows good crystallinity but is larger than those of Examples 6 through 10. Table 2 shows the results of impurity analysis conducted by dynamic SIMS. The strength of F (fluorine) is significantly reduced as compared with Reference Example 1, but is larger than those of Examples 6 through 10.

Comparative Example 3

A ZnO single crystal was produced by a liquid phase epitaxial growth (LPE) technique. Into a platinum crucible having an inner diameter of 75 mmϕ, a height of 75 mmh and a thickness of 1 mm, ZnO and $Bi_2O_3$ as materials were put in respective amounts of 95.19 g and 1635 g. In this case, the concentration of ZnO as the solute is about 25 mol %, and the concentration ratio of $PbO:Bi_2O_3$=0 mol %:100 mol %. The crucible accommodating the materials was set in the furnace shown in FIG. 5, and the materials were kept for 1 hour with the temperature at the bottom of the crucible being about 840° C. and were stirred by a Pt stirring jig to be dissolved. The materials were then cooled until the temperature at the bottom of the crucible became about 786° C. Then, a ZnO single crystalline substrate grown by a hydrothermal technique and having a size of 10 mm×10 mm×0.5 mmt with a C face was, as a seed crystal, put into contact with the melted solution, and the crystal was grown at this temperature for 6 hours while the alumina lifting shaft was rotated at 30 rpm. In this step, the rotation direction of the shaft was reversed every 2 minutes. Then, the alumina lifting shaft was lifted to be separated from the melted solution, and was rotated at 100 rpm to shake off the melted solution component. Thus, a colorless, transparent ZnO single crystal thin film was obtained. The growth rate was about 30 μm/hr. The half width of the rocking curve of the (002) face of the obtained film was about 92 arcsec., which shows good crystallinity but is larger than those of Examples 6 through 10. Table 2 shows the results of impurity analysis conducted by dynamic SIMS. The strength of F (fluorine) is significantly reduced as compared with Reference Example 1, but is larger than those of Examples 6 through 10.

TABLE 2

| | PbO mol % | $PbF_2$ mol % | $Bi_2O_3$ mol % | ZnO mol % | Growth temperature ° C. | Growth rate μm/hr | Half width of the rocking curve of the (002) face arcsec | Relative concentration of F impurities by SIMS (ratio of the F counts where Zn count is 1) |
|---|---|---|---|---|---|---|---|---|
| Hydrothermally synthesized substrate | — | — | — | — | — | — | 20 | $3.68 \times 10^{-5}$ |
| Reference Example 1 | 50 | 50 | — | 5.00 | 835 | 18 | 31 | $4320 \times 10^{-5}$ |
| Example 6 | 96.23 | — | 3.77 | 10.00 | 1055 | 30 | 31 | $58.1 \times 10^{-5}$ |
| Example 7 | 91.30 | — | 8.70 | 10.00 | 1013 | 20 | 27 | $34.5 \times 10^{-5}$ |
| Example 8 | 82.30 | — | 17.70 | 10.00 | 955 | 15 | 24 | $22.3 \times 10^{-5}$ |
| Example 9 | 66.70 | — | 33.30 | 10.00 | 898 | 2 | 21 | $3.73 \times 10^{-5}$ |
| Example 10 | 66.70 | — | 33.30 | 7.00 | 786 | 2 | 21 | $3.59 \times 10^{-5}$ |
| Comparative Example 2 | 100.00 | — | 0.00 | 5.00 | 882 | 6 | 48 | $63.4 \times 10^{-5}$ |
| Comparative Example 3 | 0.00 | — | 100.00 | 25.00 | 750 | 30 | 92 | $61.1 \times 10^{-5}$ |

As described above, a ZnO single crystal thin film can be produced on a substrate by a liquid phase epitaxial growth technique by mixing and melting ZnO as the solute and PbO and $Bi_2O_3$ as the solvents and then putting the substrate into direct contact with the obtained melted solution.

In the above examples, the half width of the rocking curve of the (002) face of the ZnO single crystal thin film produced by the LPE technique is 21 to 31 arcsec., which shows good crystallinity with no significant difference from that of a hydrothermally synthesized substrate. The F impurity concentration measured by dynamic SIMS was reduced to about 1/80 to 1/1000 of that in the case where the growth was conducted by the PbO and PbF$_2$ eutectic solvent (Reference Example 1). The ZnO single crystal obtained by the present invention has very few dislocations and defects, is not much colored and can reduce the concentration of F, which acts as impurities which provide ZnO with n-type conductivity but are difficult to be controlled or inhibit ZnO from being provided with p-type conductivity. Therefore, the ZnO single crystal obtained by the present invention is usable for electronic materials and devices using ZnO, which are expected to be developed in the future which provide Now, an embodiment of the present invention in which a ZnO single crystal is grown using an LPE furnace formed of non-Al-based materials will be described in Examples 11 and 12.

Figure 9:
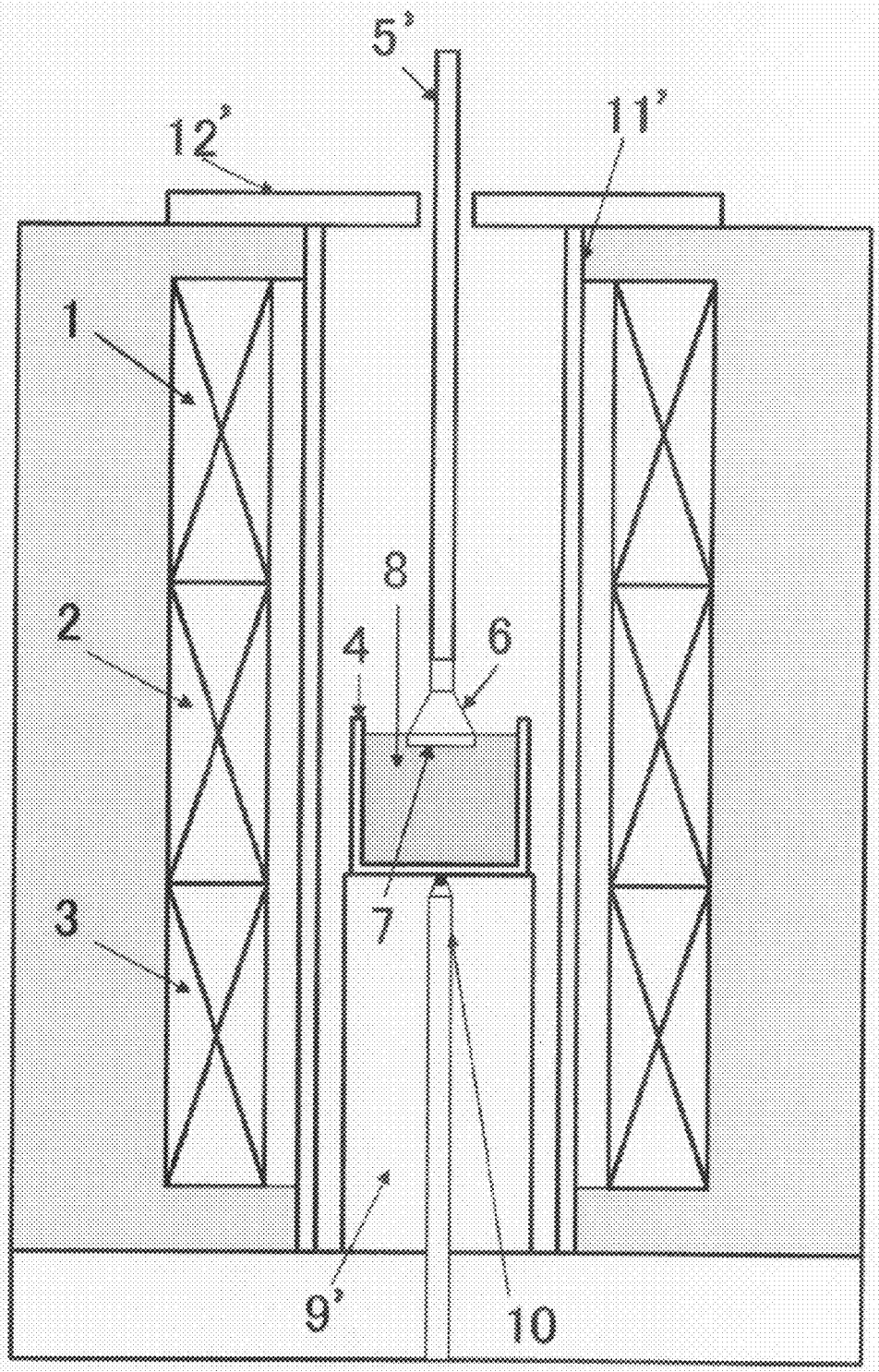
FIG. 9 is a schematic view of a ZnO single crystal production apparatus preferably used in a third embodiment of the present invention.

FIG. 9 shows a structure of the furnace used in these examples. Conditions including the temperature may be the same as those of Examples 1 through 5. In the LPE growth furnace, a Pt crucible 4 for dissolving a material and accommodating the material as a melted solution is placed on a crucible table 9' formed of MgO. Outer to, and to the side of, the Pt crucible 4, three stage side heaters (top heater 1, central heater 2, and bottom heater 3) for heating and dissolving the material in the Pt crucible 4 are provided. Outputs of the heaters are independently controlled, and the heating amounts of the heaters for the melted solution are independently adjusted. A furnace core tube 11' formed of quartz is provided between the heaters and the inner wall of the production furnace, and a furnace lid 12' formed of MgO is provided above the furnace core tube 11'. Above the Pt crucible 4, a lifting mechanism is provided. A lifting shaft 5' formed of quartz is fixed to the lifting mechanism, and a substrate holder 6 and a seed crystal or substrate 7 fixed by the holder are provided at a tip of the lifting shaft 5'. Above the lifting shaft 5', a mechanism for rotating the shaft is provided.

Example 11

A ZnO single crystal was produced by a liquid phase epitaxial growth (LPE) technique. Into a platinum crucible having an inner diameter of 75 mmφ, a height of 75 mmh and a thickness of 1 mm, ZnO, PbF$_2$ and PbO as materials were put in respective amounts of 32.24 g, 922.58 g and 839.88 g. In this case, the concentration of ZnO as the solute is about 5 mol %, and the concentration ratio of PbF$_2$:PbO as the solvents is about 50.0 mol %:50.0 mol %. The crucible accommodating the materials was set in the furnace shown in FIG. 9, and the materials were dissolved with the temperature at the bottom of the crucible being about 940° C. The materials were kept at this temperature for 3 hours and then cooled until the temperature at the bottom of the crucible became about 835° C. Then, a ZnO single crystalline substrate grown by a hydrothermal technique and having a size of 10 mm×10 mm×0.5 mmt with a C face was, as a seed crystal, put into contact with the melted solution, and the crystal was grown at this temperature for 6 hours while the quartz lifting shaft was rotated at 60 rpm. In this step, the rotation direction of the shaft was reversed every 5 minutes. Then, the quartz lifting shaft was lifted to be separated from the melted solution, and was rotated at 200 rpm to shake off the melted solution component. Thus, a colorless, transparent ZnO single crystal thin film was obtained. The growth rate was about 18 μm/hr. The rocking curve of the (002) face of the obtained film was about 31 arcsec, which shows good crystallinity. The Al impurity concentration was measured by dynamic SIMS. The results are shown in Table 3.

Example 12

A ZnO single crystal was produced by a liquid phase epitaxial growth (LPE) technique. Into a platinum crucible having an inner diameter of 75 mmφ, a height of 75 mmh and a thickness of 1 mm, ZnO, PbO and Bi$_2$O$_3$ as materials were put in respective amounts of 48.63 g, 800.61 g and 834.39 g. In this case, the concentration of ZnO as the solute is about 10 mol %, and the concentration ratio of PbO:Bi$_2$O$_3$ as the solvents is 66.70 mol %:33.30 mol %. The crucible accommodating the materials was set in the furnace shown in FIG. 9, and were dissolved with the temperature at the bottom of the crucible being about 950° C. The materials were kept at this temperature for 3 hours and then cooled until the temperature at the bottom of the crucible became 898° C. Then, a ZnO single crystalline substrate grown by a hydrothermal technique and having a size of 10 mm×10 mm×0.5 mmt with a C face was, as a seed crystal, put into contact with the melted solution, and the crystal was grown at this temperature for 6 hours while the quartz lifting shaft was rotated at 60 rpm. In this step, the rotation direction of the shaft was reversed every 5 minutes. Then, the quartz lifting shaft was lifted to be separated from the melted solution, and was rotated at 200 rpm to shake off the melted solution component. Thus, a colorless, transparent ZnO single crystal thin film was obtained. The growth rate was about 2 μm/hr. The half width of the rocking curve was about 21 arcsec., which shows good crystallinity. The Al impurity concentration was measured by dynamic SIMS. The results are shown in Table 3.

Reference Example 2

A colorless, transparent ZnO single crystal thin film was obtained by substantially the same method as in Example 2 using the furnace shown in FIG. 5. This was set as Reference Example 2. The growth rate was about 16 μm/hr. The half width of the rocking curve of the (002) face of the obtained film was about 36 arcsec., which shows good crystallinity. The Al impurity concentration was measured by dynamic SIMS. The results are shown in Table 3.

Reference Example 3

A ZnO single crystal was produced by a liquid phase epitaxial growth (LPE) technique. Into a platinum crucible having an inner diameter of 75 mmφ, a height of 75 mmh and a thickness of 1 mm, ZnO, PbO and Bi$_2$O$_3$ as materials were put in respective amounts of 48.63 g, 800.61 g and 834.39 g. In this case, the concentration of ZnO as the solute is about 10 mol %, and the concentration ratio of PbO:Bi$_2$O$_3$ as the solvents is 66.70 mol %:33.30 mol %. The crucible accommodating the materials was set in the furnace shown in FIG. 5, and were dissolved with the temperature at the bottom of the crucible being about 950° C. The materials were kept at this temperature for 3 hours and then cooled until the temperature at the bottom of the crucible became 898° C. Then, a ZnO single crystalline substrate grown by a hydrothermal technique and having a size of 10 mm×10 mm×0.5 mmt with a C face was, as a seed crystal, put into contact with the melted solution, and the crystal was grown at this temperature for 6 hours while the alumina lifting shaft was rotated at 60 rpm. In this step, the rotation direction of the shaft was reversed every 5 minutes. Then, the alumina lifting shaft was lifted to be separated from the melted solution, and was rotated at 200 rpm to shake off the melted solution component. Thus, a colorless, transparent ZnO single crystal thin film was obtained. The growth rate was about 3 μm/hr. The half width of the rocking curve was about 21 arcsec., which shows good crystallinity. The Al impurity concentration was measured by dynamic SIMS. The results are shown in Table 3.

TABLE 3

| Material of the furnace members | ZnO concentration mol % | Solvent concentration (mol %) | | | LPE temperature °C. | Growth rate μm/hr | Half width of X-ray rocking curve (002) face/ arcsec | Normalized value where the impurity concentration (SIMS) Zn = 1 | |
|---|---|---|---|---|---|---|---|---|---|
| | | PbO | PbF$_2$ | Bi$_2$O$_3$ | | | | Al | Si |
| Hydrothermally synthesized substrate | — | — | — | — | — | — | 20 | 0.00006 | 0.00004 |
| Example 11 | MgO + quartz | 5 | 50.0 | 50.0 | 0 | 835 | 18 | 31 | 0.00360 | 0.00001 |
| Example 12 | MgO + quartz | 10 | 66.7 | 0 | 33.3 | 898 | 2 | 21 | 0.00400 | 0.00001 |
| Reference Example 2 | Al$_2$O$_3$ + mullite | 5 | 50.0 | 50.0 | 0 | 835 | 16 | 36 | 0.04200 | 0.00001 |
| Reference Example 3 | Al$_2$O$_3$ + mullite | 10 | 66.7 | 0 | 33.3 | 898 | 3 | 21 | 0.25000 | 0.00002 |

As described above, using a liquid phase epitaxial growth (LPE) technique of growing a ZnO single crystal thin film on a substrate by dissolving ZnO as a solute in a solvent and then putting the substrate into direct contact with the obtained melted solution, a ZnO single crystal thin film with a low Al impurity concentration can be produced on the substrate by growing the ZnO single crystal using an LPE furnace formed of non-Al-based materials.

In the above examples, the half width of the X-ray rocking curve of the (002) face of the ZnO single crystal thin film produced by the LPE technique is 21 to 31 arcsec., which shows high crystallinity with no significant difference from that of a hydrothermally synthesized substrate. The Al impurity concentration measured by dynamic SIMS was reduced to about 1/10 to 1/80 of that in the case where the production was conducted in an LPE furnace formed of Al-based materials (Reference Examples 2 and 3). By contrast, the Si impurity concentration is about the same as that of the hydrothermally synthesized substrate with either LPE furnace. The ZnO single crystal obtained by the present invention has very few dislocations and defects, is not much colored and can reduce the concentration of Al, which acts as impurities which provide ZnO with n-type conductivity but are difficult to be controlled or inhibit ZnO from being provided with p-type conductivity. Therefore, the ZnO single crystal obtained by the present invention is usable for electronic materials and devices using ZnO, which are expected to be developed in the future.

The invention claimed is:

1. A method for producing a ZnO single crystal by a liquid phase growth technique, comprising:
providing a solution comprising a solute of ZnO and a solvent; and
putting a seed crystal or substrate into direct contact with the solution, thereby growing a ZnO single crystal on the seed crystal or substrate,
wherein:
solute:solvent=5 to 10 mol %:95 to 90 mol %, and the solvent comprises PbF$_2$ and PbO having a mixing ratio of PbF$_2$:PbO=40 to 60 mol %:60 to 40 mol %.

2. A method for producing a ZnO single crystal by a liquid phase growth technique, comprising:
providing a solution comprising a solute of ZnO and a solvent, the solvent comprising PbO and Bi$_2$O$_3$; and
putting a seed crystal or substrate into direct contact with the solution, thereby growing a ZnO single crystal on the seed crystal or substrate.

3. The method according to claim 2, wherein solute:solvent=5 to 30 mol %:95 to 70 mol %, and the mixing ratio of PbO and Bi$_2$O$_3$ is PbO:Bi$_2$O$_3$=0.1 to 95 mol %:99.9 to 5 mol %.

4. The method according to claim 1, wherein the ZnO single crystal comprises a trace amount of different type of chemical element.

5. The method according to claim 4, wherein the trace amount of different type of chemical element is 1 mol % or less of different type of chemical element.

6. The method according to claim 4, wherein the different type of chemical element is one or at least two selected from the group consisting of Li, Na, K, Cs, Rb, Be, Mg, Ca, Sr, Ba, Cu, Ag, N, P, As, Sb, Bi, B, Al, Ga, In, Tl, F, Cl, Br, I, Mn, Fe, Co, Ni, Ti, Zr, Hf, V, Nb, Ta, Cr, Mo, W and lanthanoid elements.

7. A method for producing a ZnO single crystal by a liquid phase growth technique, comprising:
providing a solution comprising a solute of ZnO and a solvent, wherein the solvent comprises PbO and Bi$_2$O$_3$; and
putting a seed crystal or substrate into direct contact with the solution, thereby growing a ZnO single crystal on the seed crystal or substrate,
wherein the ZnO single crystal is grown using a growth furnace formed of a non-Al-based material.

8. The method according to claim 7, wherein the non-Al-based material is MgO and/or quartz.

9. The method according to claim 7, wherein the growth furnace comprises a crucible table on which a crucible is allowed to be placed, a furnace core tube provided so as to surround an outer circumference of the crucible table, a furnace lid provided above the furnace core tube for opening and closing the furnace, and a lifting shaft for lifting the crucible, which are independently formed of MgO or quartz.

10. The method according to claim 2, wherein the ZnO single crystal comprises a trace amount of different type of chemical element.

11. The method according to claim 10, wherein the trace amount of different type of chemical element is 1 mol % or less of the different type of chemical element.

12. The method according to claim 10, wherein the different type of chemical element is at least one selected from the group consisting of Li, Na, K, Cs, Rb, Be, Mg, Ca, Sr, Ba, Cu, Ag, N, P, As, Sb, Bi, B, Al, Ga, In, Tl, F, Cl, Br, I, Mn, Fe, Co, Ni, Ti, Zr, Hf, V, Nb, Ta, Cr, Mo, W and lanthanoid elements.

13. A method for producing a ZnO single crystal by a liquid phase growth technique, comprising:

providing a solution comprising a solute of ZnO and a solvent, wherein the solvent comprises $PbF_2$ and PbO; and putting a seed crystal or substrate into direct contact with the solution, thereby growing a ZnO single crystal on a seed crystal or substrate, wherein:

the ZnO single crystal is grown using a growth furnace formed of a non-Al-based material, solute:solvent=5 to 10 mol %:95 to 90 mol %, and $PbF_2$:PbO=40 to 60 mol %:60 to 40 mol %.

14. The method according to claim 13, wherein the non-Al-based material is MgO and/or quartz.

15. The method according to claim 13, wherein the growth furnace comprises a crucible table on which a crucible is allowed to be placed, a furnace core tube provided so as to surround an outer circumference of the crucible table, a furnace lid provided above the furnace core tube for opening and closing the furnace, and a lifting shaft for lifting the crucible, which are independently formed of MgO or quartz.

16. The method according to claim 1, wherein providing the solution comprises mixing and melting ZnO with $PbF_2$ and PbO.

17. The method according to claim 2, wherein providing the solution comprises mixing and melting ZnO with PbO and $Bi_2O_3$.

18. The method according to claim 7, wherein providing the solution comprises mixing and melting ZnO with PbO and $Bi_2O_3$.

19. The method according to claim 13, wherein providing the solution comprises mixing and melting ZnO with $PbF_2$ and PbO.

* * * * *